United States Patent
Glidden et al.

(10) Patent No.: US 10,168,863 B2
(45) Date of Patent: *Jan. 1, 2019

(54) COMPONENT SPECIFYING AND SELECTION APPARATUS AND METHOD USING INTELLIGENT GRAPHIC TYPE SELECTION INTERFACE

(71) Applicant: Siemens Industry, Inc., Alpharetta, GA (US)

(72) Inventors: Jon Glidden, Kenosha, WI (US); Ken Stull, Buffalo Grove, IL (US); Byran Blackham, Palatine, IL (US); Jason Briggs, Chino, CA (US); Mark Halbur, Mundelein, IL (US); Leslie Hanson, Hawthorn Woods, IL (US); Elizabeth Jacobs, Fox River Grove, IL (US); Amy Rubio, Wood Dale, IL (US); Michael Rochelle, Corona, CA (US)

(73) Assignee: Siemens Industry, Inc., Alpharetta, GA (US)

( * ) Notice: Subject to any disclaimer, the term of this patent is extended or adjusted under 35 U.S.C. 154(b) by 883 days.

This patent is subject to a terminal disclaimer.

(21) Appl. No.: 14/559,681

(22) Filed: Dec. 3, 2014

(65) Prior Publication Data
US 2015/0089380 A1    Mar. 26, 2015

Related U.S. Application Data

(63) Continuation of application No. 13/441,536, filed on Apr. 6, 2012, now Pat. No. 8,930,821.
(Continued)

(51) Int. Cl.
*G06F 3/00* (2006.01)
*G06F 3/0482* (2013.01)
(Continued)

(52) U.S. Cl.
CPC ........ *G06F 3/0482* (2013.01); *G06F 3/04817* (2013.01); *G06F 3/04842* (2013.01);
(Continued)

(58) Field of Classification Search
None
See application file for complete search history.

(56) References Cited

U.S. PATENT DOCUMENTS 6,008,809 A * 12/1999 Brooks ................. G06F 3/0481
   715/792
6,018,346 A    1/2000 Moran et al.
(Continued)

OTHER PUBLICATIONS

Bob Jones, Client / Server development tools, Mar. 9, 1992, Computerworld, Edition or vol. 26, 10; pp. 73-74 (Year: 1992).*

(Continued)

*Primary Examiner* — Tam T Tran

(57) ABSTRACT

A method generates an output identifying components for a system, each of the components having one of a plurality of types, each of the components defined by a plurality of specifications. The method includes employing a network interface to receive a selection tool into a computer system memory. The method further includes executing the selection tool on a processing device to: open a multi-window display that includes a schedule window, a product type select window, and a product window; display a menu of a plurality of graphic elements; receive a user input selecting a first graphic element from the menu; update the multi-window display to display the menu of the plurality of graphic elements without the first graphic element and to display the first graphic element in the product type select window; and filter a component database to identify components having a component type corresponding to the first graphic element.

15 Claims, 19 Drawing Sheets

Related U.S. Application Data

(60) Provisional application No. 61/473,606, filed on Apr. 8, 2011.

(51) Int. Cl.

| | | |
|---|---|---|
| *G06F 17/50* | (2006.01) | |
| *G06F 3/0481* | (2013.01) | |
| *G06F 3/0484* | (2013.01) | |
| *G06F 17/30* | (2006.01) | |
| *H04L 29/08* | (2006.01) | |

(52) U.S. Cl.
CPC .... *G06F 17/30867* (2013.01); *G06F 17/5004* (2013.01); *H04L 67/10* (2013.01)

(56) References Cited

U.S. PATENT DOCUMENTS

| | | | | |
|---|---|---|---|---|
| 6,604,108 | B1* | 8/2003 | Nitahara | G06F 17/30312 |
| 2002/0030689 | A1 | 3/2002 | Eichel et al. | |
| 2004/0215556 | A1* | 10/2004 | Merkley, Jr. | G06Q 30/02 |
| | | | | 705/38 |
| 2005/0049811 | A1* | 3/2005 | Gedamu | G01R 31/07 |
| | | | | 702/117 |
| 2006/0218506 | A1 | 9/2006 | Srenger et al. | |
| 2008/0015823 | A1* | 1/2008 | Arnold | G06F 8/20 |
| | | | | 703/1 |
| 2008/0177581 | A1* | 7/2008 | Artinger | G06Q 40/08 |
| | | | | 705/4 |
| 2009/0007009 | A1* | 1/2009 | Luneau | G06F 3/0482 |
| | | | | 715/808 |
| 2009/0070687 | A1 | 3/2009 | Mazaferri | |
| 2009/0077497 | A1* | 3/2009 | Cho | G06F 3/04817 |
| | | | | 715/814 |
| 2009/0248545 | A1* | 10/2009 | Robinson | G06Q 30/0601 |
| | | | | 705/26.1 |
| 2010/0100844 | A1 | 4/2010 | Narahashi et al. | |
| 2011/0066980 | A1* | 3/2011 | Chmielewski | G06F 3/0482 |
| | | | | 715/834 |
| 2011/0078055 | A1* | 3/2011 | Faribault | G06Q 30/02 |
| | | | | 705/27.2 |
| 2012/0054026 | A1* | 3/2012 | Robinson | G06Q 30/02 |
| | | | | 705/14.49 |

OTHER PUBLICATIONS

Li Chen et al., Interaction design guidelines on critiquing-based recommender systems, Sep. 19, 2007, Springer Science & Business Media, pp. 167-206 (Year: 2007).*

* cited by examiner

COMPONENT SPECIFYING AND SELECTION APPARATUS AND METHOD USING INTELLIGENT GRAPHIC TYPE SELECTION INTERFACE

This application is a continuation of U.S. patent application Ser. No. 13/441,536, filed Apr. 6, 2012, which claims the benefit of U.S. Provisional Patent Application Ser. No. 61/473,606, filed Apr. 8, 2011, and which is incorporated herein by reference.

FIELD OF THE INVENTION

The present invention relates to component ordering systems, and in particular, to user interface methods and apparatus for component ordering systems.

BACKGROUND

Building systems include security systems, fire safety systems, and comfort control systems, also known as heating, ventilation and air conditioning (HVAC) systems. Such systems, particularly in large buildings, can include thousands of components, such as controllers, valves, ventilation damper boxes, ductwork, sensors, and air handing equipment. Defining all of the elements of a building system during the construction phase of a building can be a complex task. For example, a building system may employ many valves of different types, sizes, and configurations. A system designer often must select from hundreds of commercially available valve options for the various valve requirements of the system. Such a task can be time consuming.

To assist in the ordering of components such as valves, software systems have been developed that allow the user to select components for purchase by allowing the user to define requirements of the parts, and then providing the user with suggested available components from a database. One of the drawbacks of such systems, however, is that they are primarily text driven, and consequently present a non-intuitive, cluttered display.

There is a need, therefore, for a component specification and selection system that provides a more intuitive interactive experience.

SUMMARY

At least some embodiments of the present invention address the above-referenced issue by providing a system and method of specifying and selecting components having one or more of the features described herein. Such features, either alone or in combination, facilitate an enhanced product selection experience, particularly in the selection of multiple components with various requirements from a large number of choices.

A method generates an output identifying components for a system. Each of the components has one of a plurality of types, and each of the components is defined by a plurality of specifications. The method includes employing a network interface to receive a selection tool into a computer system memory. The method also includes executing the selection tool on a processing device to perform multiple operations. One operation is opening a multi-window display that includes a schedule window, a product type select window, and a product window. Another operation includes displaying a menu of a plurality of graphic elements, each of the plurality of graphic elements representative of and corresponding to a product type. A user input selecting a first graphic element from the menu is received, and the multi-window display is displayed such that the first graphic element appears in the product type select window. In another operation, a component database is filtered to identify a first set of components having a component type corresponding to the first graphic element. Still another operation includes displaying in the product window data a list of components from the first set of components.

The features and advantages of the embodiments described herein will become more readily apparent to those of ordinary skill in the art by reference to the following detailed description and accompanying drawings.

DETAILED DESCRIPTION

Figure 1:
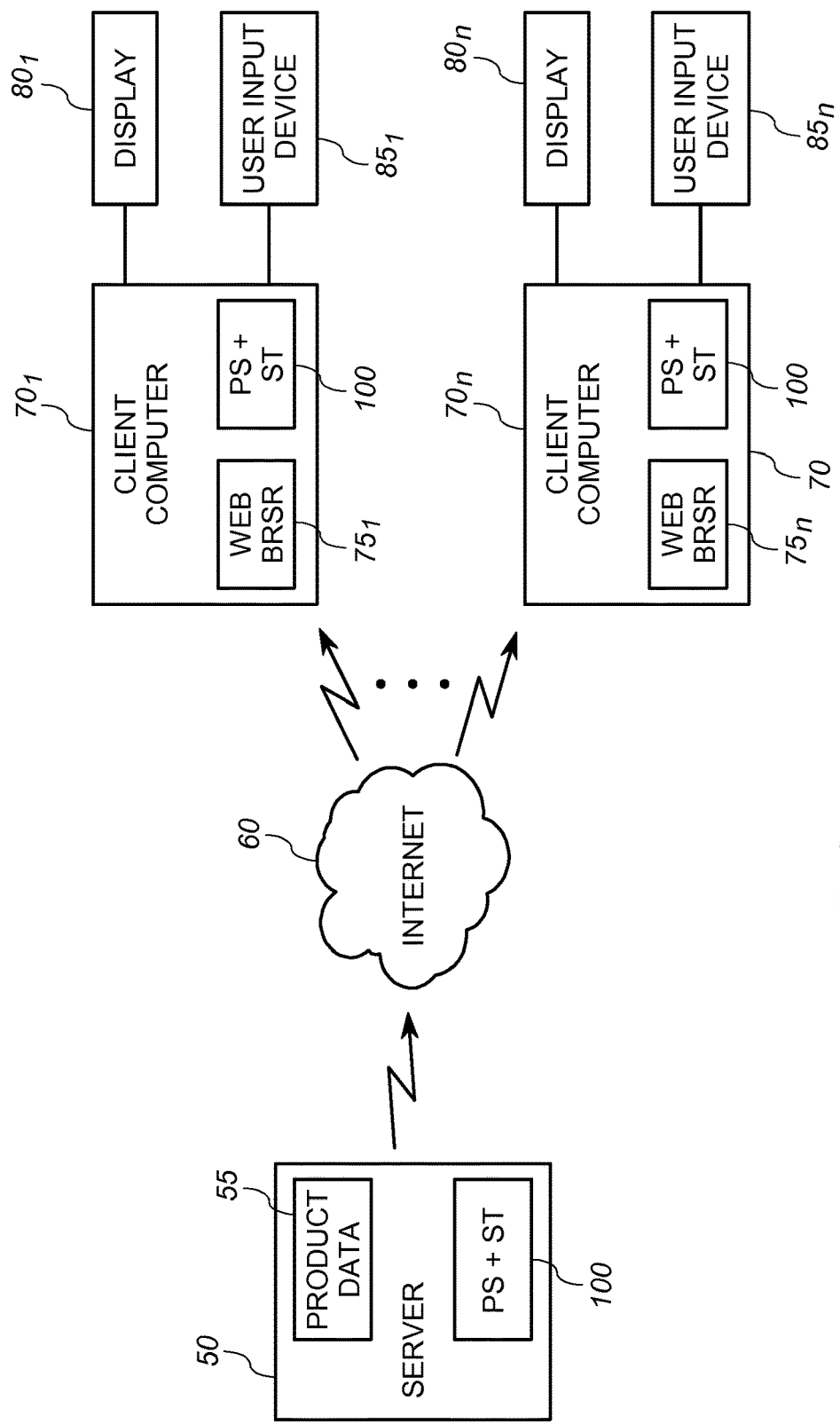
FIG. 1 is a schematic block diagram of a system in which exemplary embodiments of the invention may be employed.

FIG. 1 shows a block diagram of a system in which exemplary embodiments of the invention may be employed. The system 10 includes a server 50 operably coupled to a plurality of client devices $70_1 \ldots 70_n$ via an internetwork such as the Internet 60. The server includes product data 55 and a product sizing and selection tool ("PSST") 100. The product data 55 may suitably be data stored in a database. The PSST 100 comprises a downloadable software tool that, when executed at a suitable client machine, allows for sizing and selection of component parts of a system using one or more of the novel methods described herein. Further detail regarding an exemplary embodiment of the server 50 is provided below in connection with FIG. 2.

The client device $70_1$ may suitably be a general purpose desktop, laptop, tablet, or other suitable computer having a web browser $75_1$, a display $80_1$ and a user input device $85_k$. As shown in FIG. 1, the client device $70_1$ also includes the PSST 100, which has been downloaded from the server 50. Additional client devices, such as the client device $70_n$, have corresponding structures. However, it will be appreciated that each of the client devices $70_1 \ldots 70_n$ may comprise any form of suitable computer device, and need not employ the same display, user input device or web browser.

In operation, the web server 50 downloads a copy of the PSST 100 upon receiving a request from a corresponding client computer, e.g. the client computer $70_1$ and/or $70_n$. Each of the client computers $70_1 \ldots 70_n$ requesting the PSST 100 receives and executes the PSST 100, through the respective web browser $75_1 \ldots 75_n$. As will be discussed further below in detail, the client computers $70_1 \ldots 70_n$, execute the downloadable tool to define a schedule of components for a system, such as, for example, valves for a building automation system. Upon selection by a corresponding user, each of the client computers $70_1 \ldots 70_n$ generates an output file and transmits the output file to a web store or the like to effectuate the ordering of the components listed on the schedule. The client computers $70_1 \ldots 70_n$ can also print out the schedule of components, or store the output file for later use.

Figure 2:
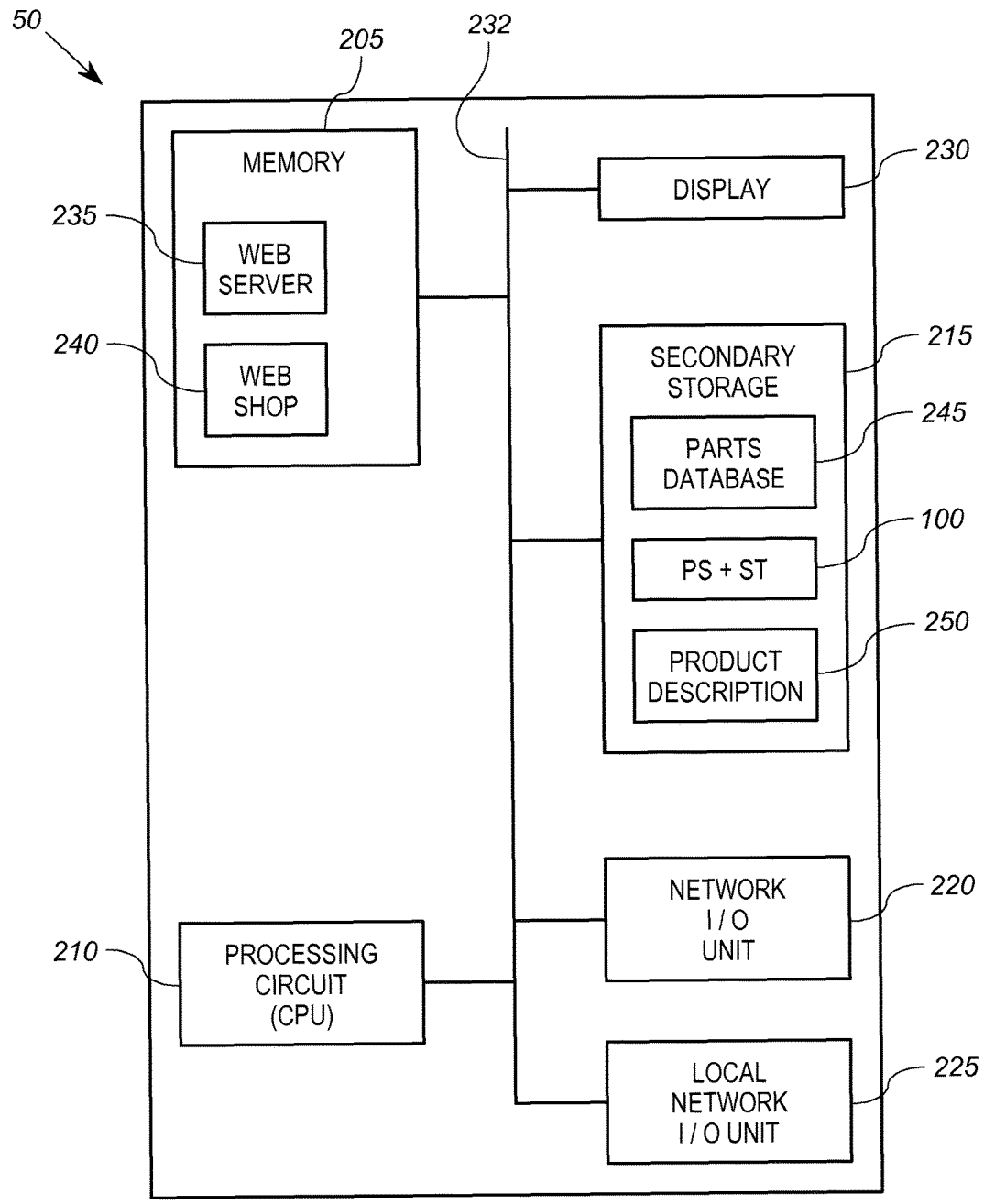
FIG. 2 is a schematic block diagram of a server computer of the exemplary system of FIG. 1

FIG. 2 shows a schematic block diagram of an exemplary embodiment of a server computer 50 that may be employed in the system of FIG. 1 The server computer 50 includes a memory 205, a central processing unit (CPU) 210, secondary storage 215, a network input/output (I/O) unit 220, a local network I/O unit 225, and a display 230. All of the components 205, 210, 215, 220, 225 and 230 are connected by at least one data bus 232. The server computer 50 may suitably be implemented as a general purpose computer configured to operate as a web server device.

The memory 205 is any suitable memory capable of storing instructions to be executed by the CPU 210. The memory 205 may suitably include or comprise random access memory. In the embodiment described herein, the memory 205 stores executable web server instructions 235 and executable web store instructions 240. The web server instructions 235, when executed by the CPU 210, operate to interact with web clients, such as the web client $70_1$, as will be discussed further below. The web store instructions 240 are software instructions that, when executed by the CPU 210, enable a secure online purchasing environment, wherein orders can be taken for components specified by user input, and/or via receipt of a data file describing a schedule of goods to be purchased. Suitable instructions to carry out an online web store would be known to those of ordinary skill in the art. In some embodiments, the web store instructions 240 are stored in the memory of a separate computer, not shown, but which can be accessed by the clients $70_1 \ldots 70_n$ via the Internet 60.

The secondary storage 215 comprises non-volatile memory that may be housed in the same housing as the CPU 210, but in alternative embodiments is separately housed and accessed via a network. The secondary storage 215 store the PSST 100, a parts database 245, and a product description database 250. The parts database 245 and the product description database 250 in this embodiment form the product data 55 of FIG. 1. As discussed above the PSST 100, contains instructions that, when executed in a client computer, carries out operations described below in connection with FIGS. 5 to 11. It will be appreciated that the product description database 250 may alternatively be stored in another computer system that is also accessible via the Internet. For example, if the web store instructions 240 are executed on a separate computer, then the product description database may also be stored on that computer.

Figure 23:
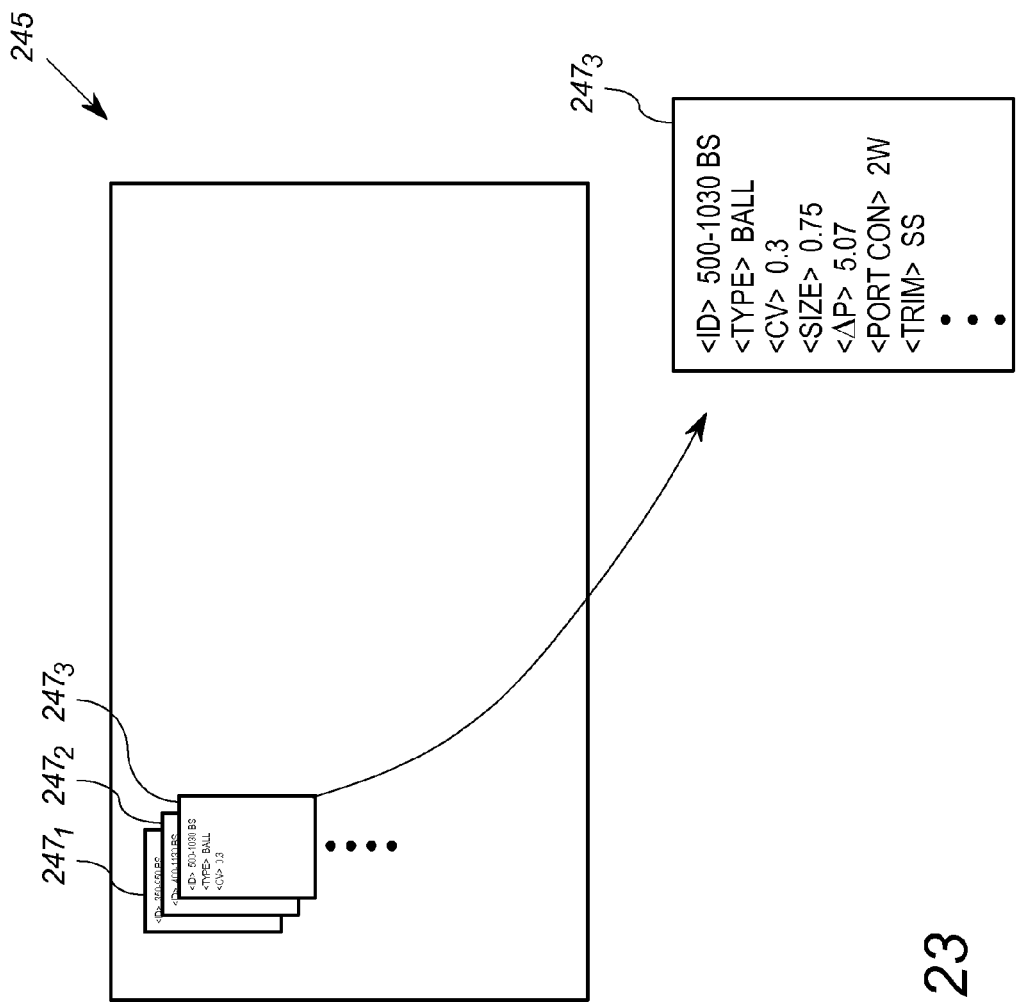
FIG. 23 shows a representative diagram of an exemplary parts database that may be used by the client computer executing the product specifying and selection tool.

The parts database 245 is a searchable database of records for available components, e.g. valves or other components, along with parameters for each of the available components. For example, a database record for valves may include data identifying sizing and configuration parameters. FIG. 23 shows a representative diagram of an exemplary database that may be used as the database 245.

Referring to FIG. 23, the parts database includes a plurality of data records $247_1, 247_3, 247_2$, and so forth. Each of the data records $247_n$ is associated with a valve that may be specified in a schedule of parts for a building system. Each of the data records 247.sub.n includes a part identifier ("ID"), a type identifier ("type"), and a set of valve parameters. In this embodiment, the valve type is one of the following valve types: ball; butterfly; globe; magnetic; and zone. The valve parameters can include the different media (steam, water, coolant) the valve can accept; the flow coefficient ("CV"), the line size that the valve is compatible with, and the pressure drop and flow capacity of the valve. Such parameters can further include the port configuration of the valve, the valve trim, the connections, the pressure class, the flow characteristics and the disc type of the valve. The availability of many or all of these parameters for commercially available valves is typically available from datasheets and/or other conventional sources.

By way of example, FIG. 23 shows an enlarged version of the valve data record $247_3$ in which many, but not all of the fields of the data record are shown. In the data record $247_3$, the valve ID is a product number, which in this case is "500-10308S", the valve type is "ball", the flow coefficient value is "0.3", the size is "0.75", the pressure drop value is "5.07", the port configuration is "2W", and the trim value is "SS".

It will be appreciated that other types of valves may optionally be incorporated, such as pressure independent control valves. In such a case, the valve parameters can include the "required flow" of the pressure independent control valve.

In any event, the product description database 250 is a searchable set of records for each valve that includes a user-readable product description, such as a data sheet or other product literature, in a document file format. For example, the product description record for each valve in the product description database 250 may suitably be a .pdf formatted file with drawings, written text, and parameters, in user readable form.

The network I/O 220 may suitably be any communication connection to the Internet, such as a DSL modem, a T1 interface, or other Internet connection. Such devices are known in the art. The local network I/O 325 is a LAN interface or the like. In some cases, the server computer 50 connects to the Internet using a LAN or WAN, in which case only a single network I/O 325 would be required.

Figure 3:
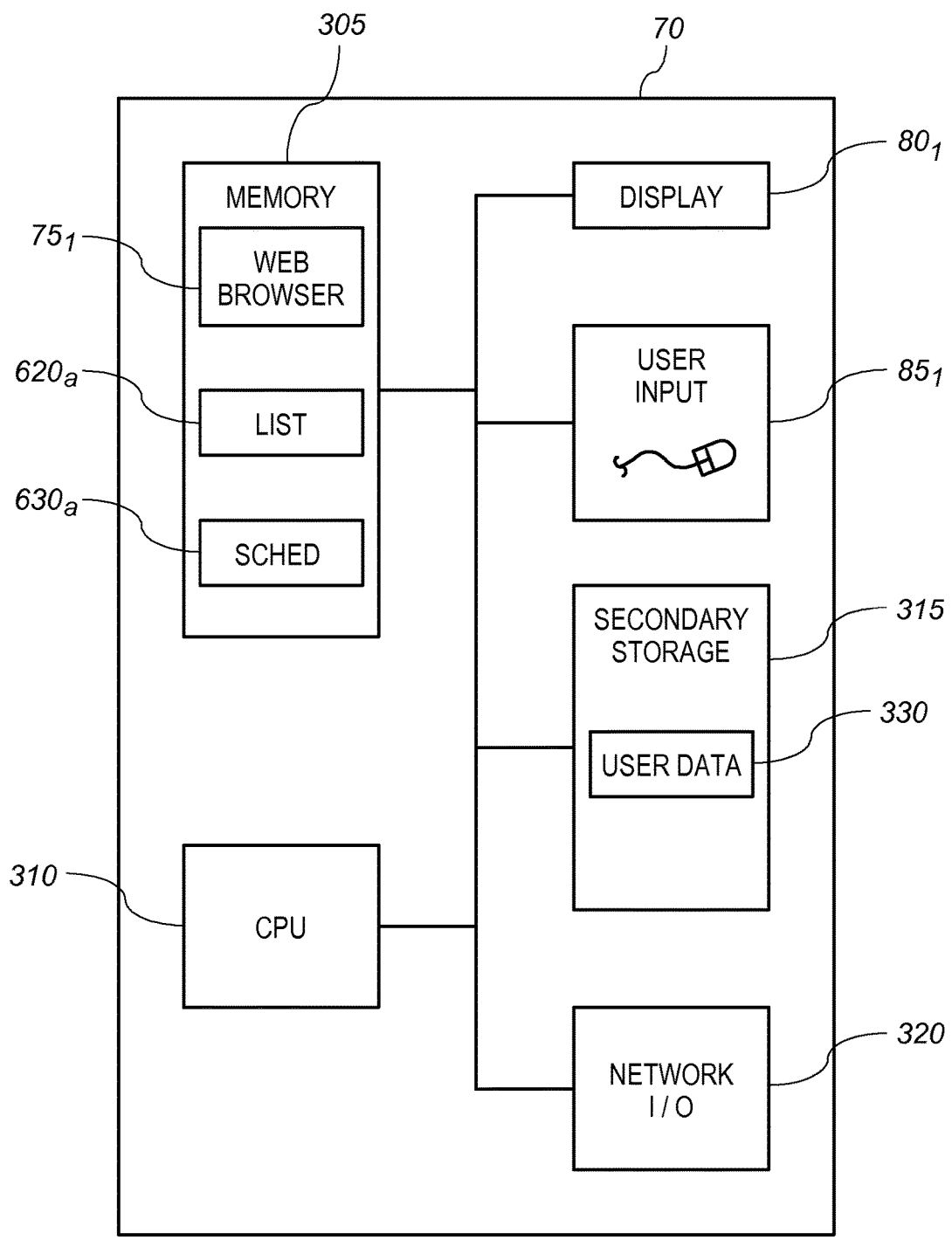
FIG. 3 is a schematic block diagram of an exemplary client computer that may be used to implement methods according to the invention.

FIG. 3 shows a schematic block diagram of an exemplary embodiment of a client computer $70_1$ that may be employed in the system of FIG. 1. Similar to the server 50, the client computer $70_1$ includes a memory 305, a central processing unit (CPU) 310, secondary storage 315, a network input/output (I/O) unit 320, a display $80_1$, and a user input device $85_1$. The client computer $70_1$ may suitably be implemented as a general purpose computer.

The memory 305 is any suitable memory capable of storing instructions to be executed by the CPU 310, as well as runtime data files and data values generated by the CPU 310. The memory 305 may suitably include or comprise random access memory. In the embodiment described herein, the memory 305 stores executable web browser instructions $75_1$. The web browser instructions $75_1$, when executed by the CPU 310, provide an interface to files/data transmitted via the World Wide Web, as is known in the art. The secondary storage 315 comprises non-volatile memory that may be housed in the same housing as the CPU 310. The secondary storage 315 further contains a user data file 330 containing, among other things a "list of favorites", which will be discussed further below.

In general, the client computer $70_1$ may be any commercially available home or business personal computer configured for generate Internet communications and functionality. Accordingly, the client computer $70_1$ includes suitable software environment operating system, such as, for example the WINDOWS® 7 operating system available from Microsoft Corporation.

Figure 4:
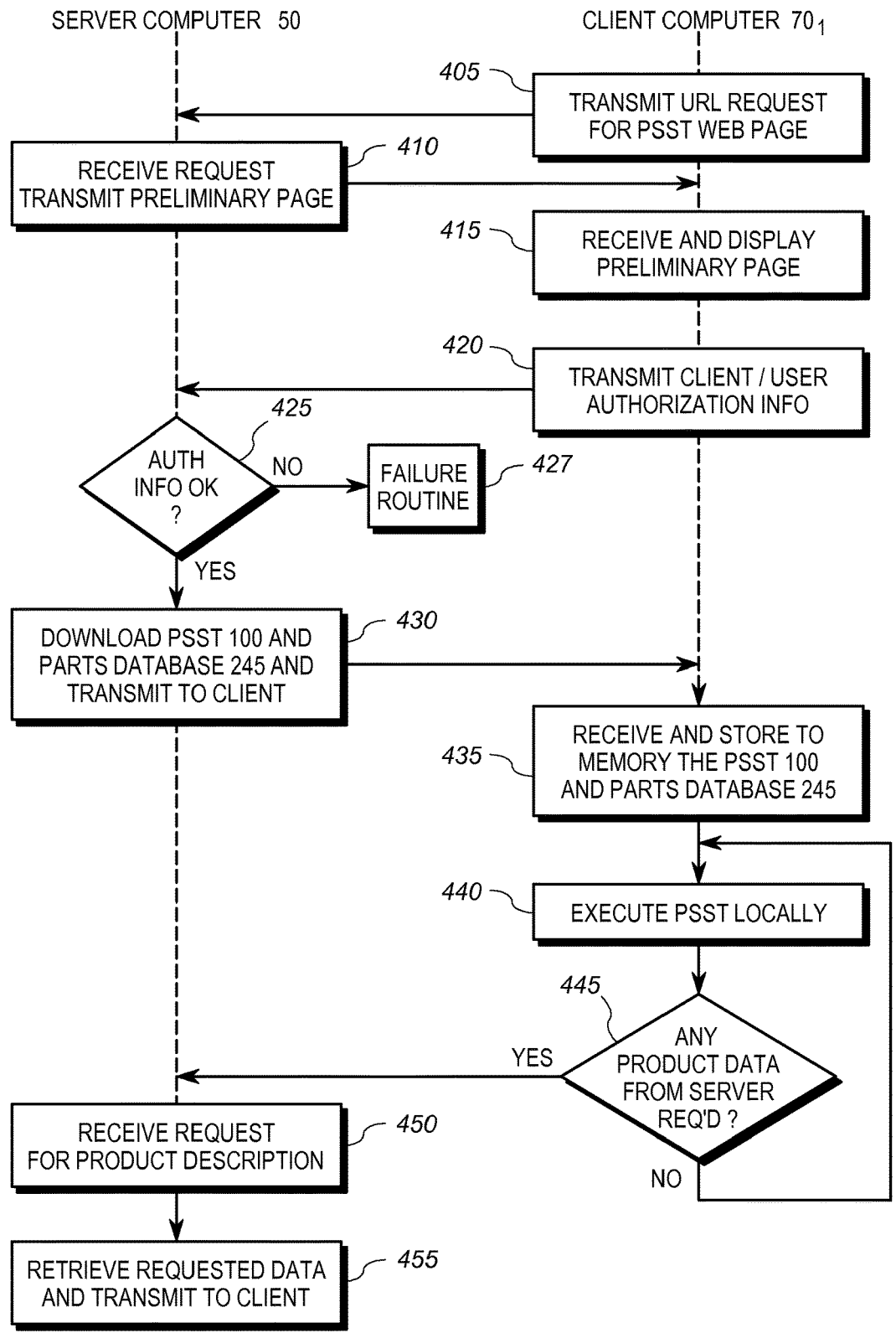
FIG. 4 shows a flow diagram of an exemplary set of operations that may be carried out by the system of FIG. 1.

FIG. 4 shows a flow diagram overview of the operations of the server computer 50 and the client computer $70_1$ of FIGS. 1-3 in carrying out an embodiment of a method according to the invention. In the flow diagram overview of FIG. 4, the operations of the server computer 50 are carried out by the CPU 210 executing the server instructions 235. Similarly, the operations of the client computer $70_1$ are carried out by the CPU 310 executing the web browser instructions $75_1$ and, in the case of steps 435 and 440, the CPU 310 executing the downloaded PSST 100. All interactions between the CPU 210 and the CPU 310 in this embodiment occur over the Internet 60 of FIG. 1.

In step 405, the client computer $70_1$ generates a URL request for the website hosted at the server computer 50 for the PSST 100. In step 410, the server computer 50 receives the request, and transmits to the client computer $70_1$ a preliminary webpage seeking authentication information from the client/user. In step 415, the client computer $70_1$ receives the preliminary webpage, and causes it to be displayed (on display $80_1$). In step 420, the client computer $70_1$ transmits any client/user authentication information to the server computer 50. The client computer $70_1$ may suitably generate the authentication information from client/user input, or from a local data file. The authentication information in the exemplary embodiment comprises a user name and a password.

In step 425, the server computer 50 receives the client/user authentication information and determines whether the authentication information is correct. If so, then the server computer 50 proceeds to step 430. If not, then the server computer 50 performs one or more authentication failure routines (step 427). For example, the failure routines may allow the client/user additional attempts at authentication before terminating the session. The server computer 50 may also utilize standard means for the client/user to recover a secure password.

The authentication features are conventional and the details of such features are outside the scope of the present invention. Indeed, at least some embodiments of the invention will not require any authentication at all. It may be preferable in a vendor/customer relationship to avoid the need for authentication. In such other embodiments, steps 410, 415, 420, 425 and 427 may be eliminated altogether.

In step 430, the server computer 50 downloads the PSST 100 and parts database 245 from its secondary storage 215 to the client computer $70_1$. In step 435, the client computer $70_1$ stores the PSST 100 and parts database 245 in memory 305. The client computer $70_1$ typically first stores the PSST 100 and the parts database 245 in secondary storage 315, before executing from the memory 305.

Thereafter, in step 440, the client computer $70_1$ begins to execute the PSST 100. The client computer $70_1$, executing the PSST 100, performs the operations discussed below in connection with FIGS. 5 to 22. From time to time, the client computer $70_1$ executing the PSST 100 may require additional information from the server computer 50. Specifically, as will be discussed below, specific requests for product description information may be generated during operation of the PSST 100. If such information is required (step 445), the client computer $70_1$ transmits a request to the server computer 50 for specified product description information. In step 450, the server computer 50 receives the request. The server computer 50 thereafter executes step 455. In step 455, the server computer 50 retrieves the requested information from the product description database 250, and transmits the retrieved information to the client computer $70_1$. The client computer $70_1$ continues local execution of the PSST 100 (step 445), and uses the retrieved information accordingly.

Figure 5:
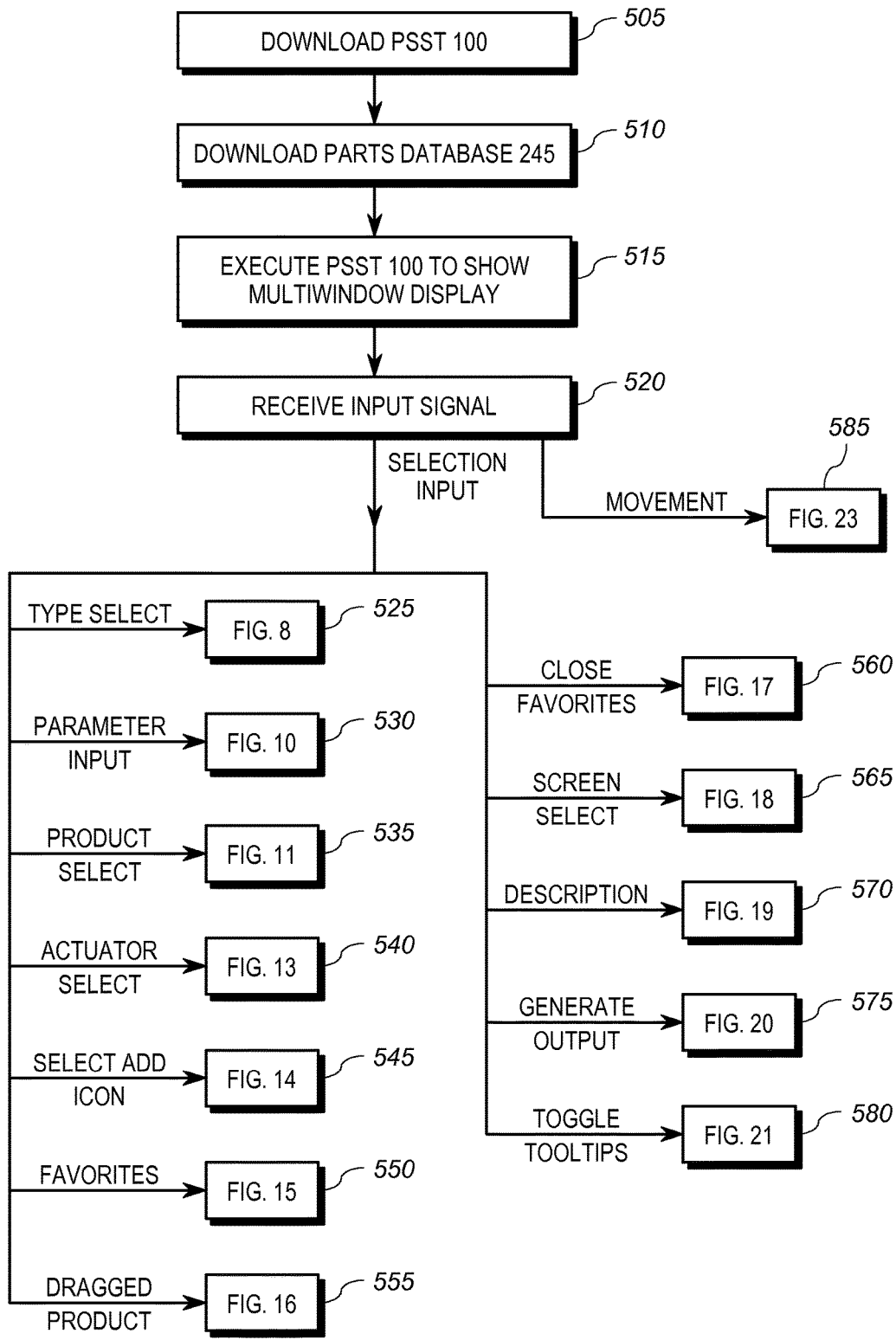
FIG. 5 shows a flow diagram of an exemplary set of operations that may be carried out by a client computer executing a product specifying and selection tool of the system of FIG. 1.

FIG. 5 shows in further detail the operations of the CPU 310 of the client computer $70_1$ (and any other suitable client computer) in downloading and executing the PSST 100. In step 505, the CPU 310 downloads the PSST 100 as per step 435 of FIG. 4. The CPU 310 stores the PSST 100 in memory 305 to facilitate execution thereof. Additionally, in step 510, the CPU 310 downloads, and stores in memory 305, the parts database 245. The parts database may also be stored in the secondary storage 315.

Figure 6:
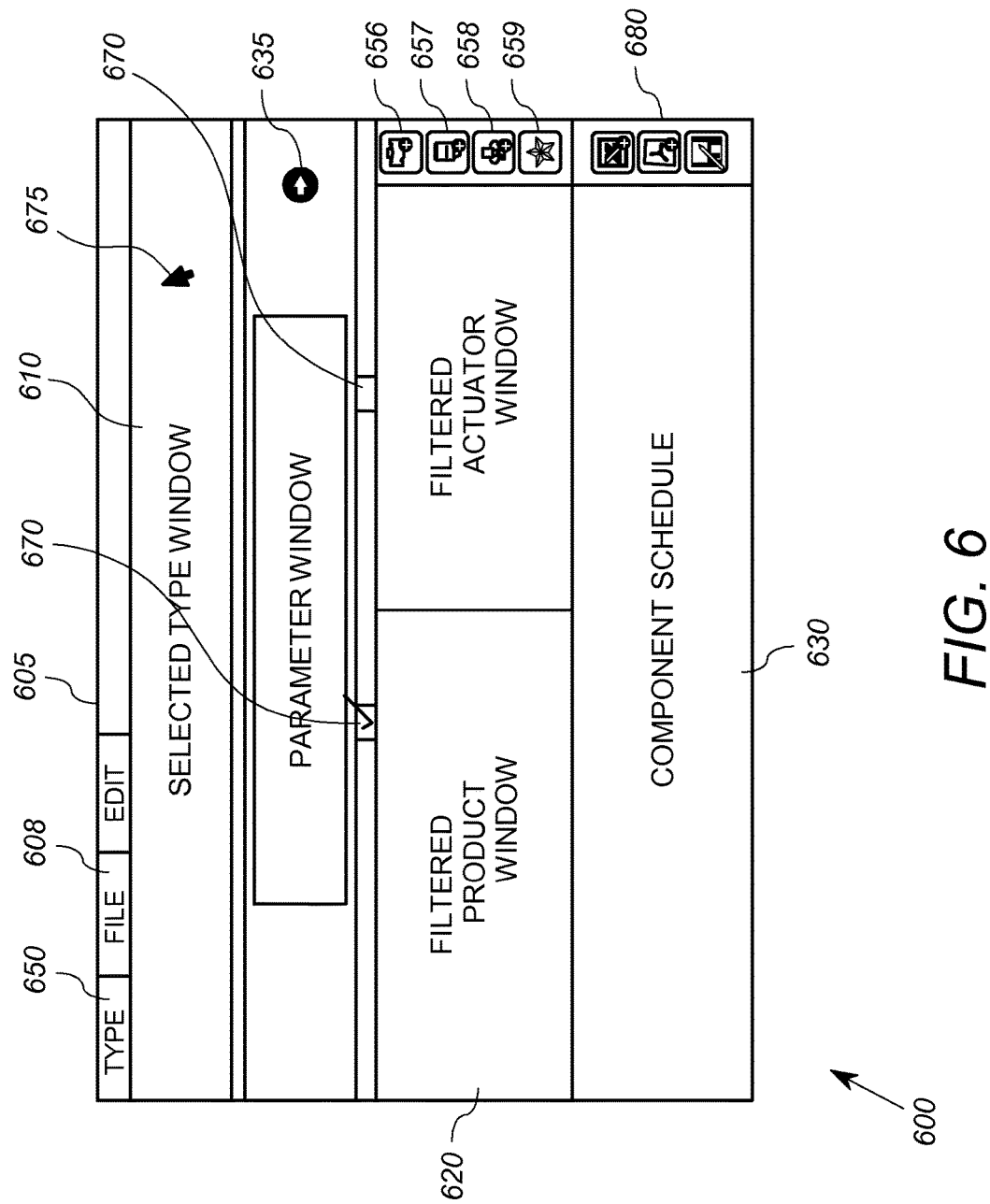
FIG. 6 shows a block diagram representation of an exemplary layout of a multi-window user interface graphic of the product specifying and selection tool of the system of FIG. 1.

In step 515, the CPU 310 executes the PSST 100 to cause rendering of a multi-window user interface graphic on the display $80_1$. FIG. 6 shows an exemplary functional diagram of the multi-window UI graphic 600, and FIG. 7 shows in further detail an exemplary embodiment of the multi-window UI graphic 600 as it pertains to components in the form of valves.

Figure 7:
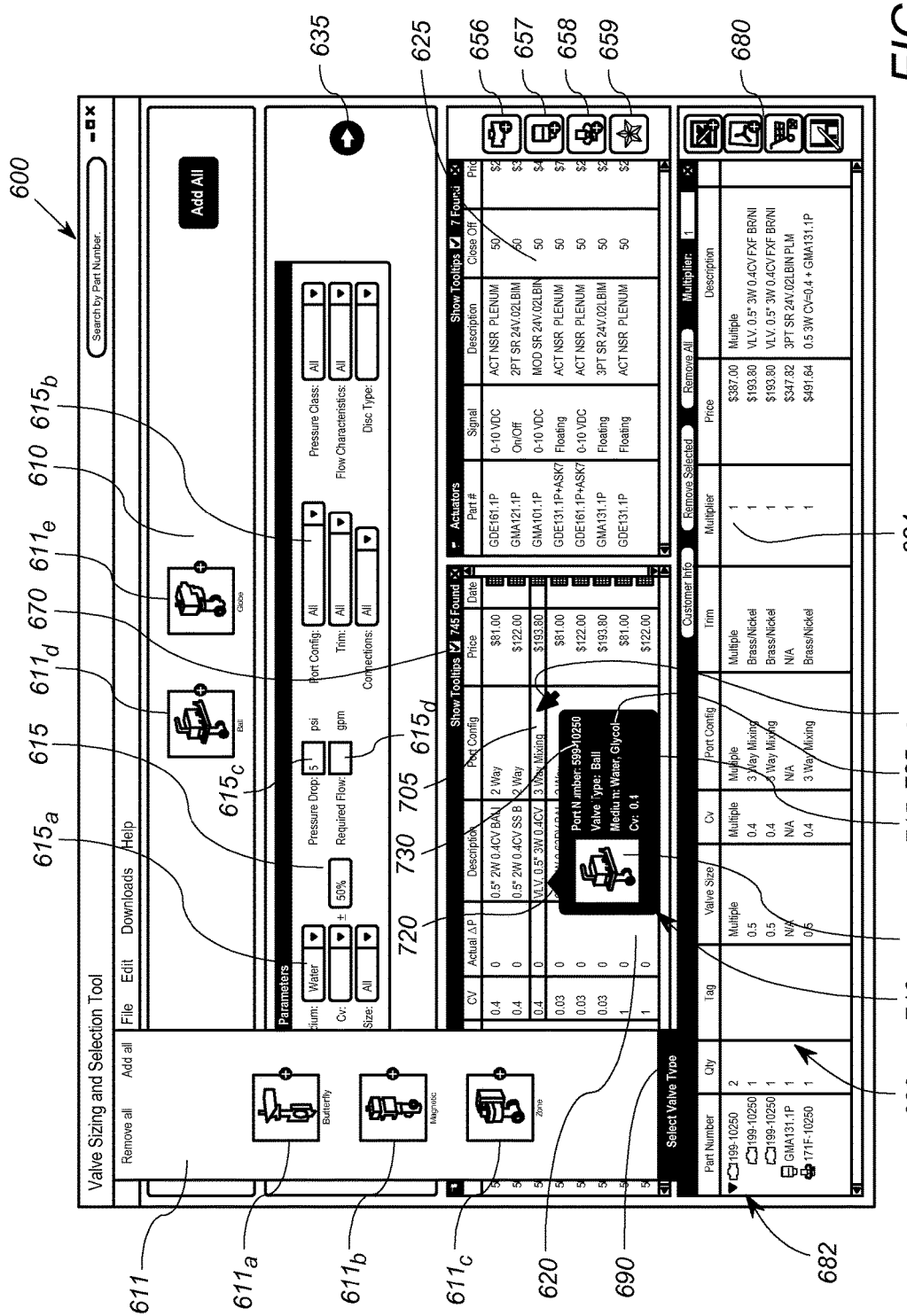
FIG. 7 shows an exemplary user interface screen of a first embodiment of the multi-window user interface graphic of FIG. 6.

With reference to both FIGS. 6 and 7, the UI graphic 600 includes customary menu and tool bars 605, a selected type window 610, a parameter window 615, a filtered product window 620, a filtered actuator window 625, a component schedule window 630. The UI graphic 600 also includes an arrow graphic or icon 635. The UI graphic 600 further includes an "add valve" icon 656, an "add actuator" icon 657, an "add assembly" icon 658, a "favorites" icon 659, and a "tooltips" check boxes 670. The UI graphic 600 further includes a movable cursor 675 that is employed to allow the user to navigate within the UI graphic 600. FIG. 7 shows the UI graphic 600 configured for components in the form of valves. Additional features of the exemplary UI graphic 600 as it appears in FIG. 7 will be discussed further below.

In its basic form, the UI graphic 600 constitutes the workspace in which a client/user may define the type of component (via a type select icon 650 of the menu and tool bars 605), and define one or more parameters of the component (via the parameter window 615). The CPU 310, in response to either type or parameter definitions, generates a list of potentially compatible devices in the filtered product window 620. In general, each entry in the list has a part number, a price, a manufacturer ID and other information. The other information may include any attributes (size, etc.) that are either pre-selected, or selectable by the user by any suitable menu-driven or other the method.

The products in the list in the filtered product window 620 have been filtered from the entire product list in the parts database 245. The filtering produces those products that have one of the types selected by the user (in selected type window 610), and have parameters that correspond to the parameters identified (in parameter window 615). The client/user may select products in the filtered product window 620 for inclusion in the component schedule window 630, which is a list of the products the client/user has included as part of the current project. The client/user may also highlight one or more specific products in the filtered product window 620 to obtain a list of actuators in the filtered actuator window 625 that are compatible with the highlighted product. Further details regarding each of these features of the PSST 100, as well as others, will be described below in detail.

With further reference to the component schedule window 630, the window 630 includes identification of each product, component or assembly selected by the user (in various ways discussed below), and parameters or information about such selected items, presented in columns. The additional parameters or information include price, quantity, operating parameters and the like. In some embodiments, the user can manipulate which product information and parameters are presented in the component window. The user may also select the various column headings to sort selected products in the component schedule window 630. The details of such operations are conventional.

In addition, the component schedule window 630 in this embodiment includes a user-editable "tag" field, shown as column 690 of FIG. 7. In particular, the PSST 100 is configured such that the user may also "tag" items (enter text) on a line-by-line basis, thus allowing sorting by user-defined tags. For example, the user may select to tag some items as "building 3", some items as "building 8", and all other items as "building 1". The user may then select the "tag" column heading, thereby resulting in organization of the items on the list by "building 1", "building 3" and "building 8" designations. These tags become part of the schedule list 630*a*, discussed further below.

The schedule window 630 also provides a multiplier column 684 for pricing adjustment on an item by item basis.

Referring again to FIG. 5, the CPU 310 in step 520 receives input from the client/user interacting with the UI graphic 600. In general, the user input signals include those that move or change position of the cursor 675, or select an item over which the cursor 675 is positioned, as is conventional in graphical user interfaces. To create such signals, the user manipulates the user input device 85.sub.1, which may suitably be a pointing device such as a so-called mouse, a touch screen, or other device or combination of devices. The user manipulates the user input device 85.sub.1 to move the cursor 675 to locations within the UI graphic 600 and may or may not select items within the UI graphic 600.

Referring to specifically to the flow diagram of FIG. 5, the CPU 310 receives a user input in step 520. The input may be a movement signal indicating an input associated with moving the cursor 675, in which case the CPU 310 executes step 585, discussed further below. The input may also be a selection input signal, which is associated with a selection (such as a left click of a mouse). As will be discussed further below, inputs in some cases can involve movement signal with a second element to indicate a user desire to drag an graphical element. In general, such input signals from a user input device $85_1$ are conventional in nature.

Referring specifically to FIG. 5, upon receiving a selection input, the CPU 310 determines further action based on the current location of the cursor 675 with respect to the UI graphic 600, as is conventionally done. Steps 525-580 represent the different actions that take place based upon the location of the cursor 675 when the selection input signal is received.

In particular, if in step 520, the cursor 675 is located over the type select menu/icon 650 (see FIG. 6) when the select input signal is received, then the CPU 310 performs the Type Select routine, step 525, discussed below in connection with FIG. 8.

If, in step 520, the cursor 675 is located over a parameter definition icon, text box, or other interactive element in the parameter window 615 when the select input signal is received, then the CPU 310 performs the Parameter Input routine, step 530, discussed below in connection with FIG. 10.

If, in step 520, the cursor 675 is located over a product in the filtered product window 620 when the select input signal is received, then the CPU 310 performs the Product Select routine, step 535, discussed below in connection with FIG. 11.

If, in step 520, the cursor 675 is located over an actuator in the filtered actuator window 625 when the select input signal is received, then the CPU 310 performs the Actuator Select routine, step 540, discussed below in connection with FIG. 13.

If, in step 520, the cursor 675 is located over an "add" icon, such as icons 656, 657, or 658 when the select input signal is received, then the CPU 310 performs the Schedule Add routine, step 545, discussed below in connection with FIG. 14.

If, in step 520, the cursor 675 is located over the "select favorites" icon 659 when the select input signal is received, then the CPU 310 performs the Favorites routine, step 550, discussed below in connection with FIG. 15.

If, in step 520, the cursor 675 is over a valve or actuator element in windows 620, 625 or 685 (see FIG. 24) when both a select input signal and a move cursor signal is received, (i.e., an object is being "dragged" in the conventional GUI sense), then the CPU 310 performs the Dragged Product routine, step 555, discussed below in connection with FIG. 16.

If, in step 520, the cursor 675 located over the close window icon 688 of the favorites window 685 (see FIG. 24), when the select input signal is received, then the CPU 310 performs the Close Favorites routine, step 560, discussed below in connection with FIG. 17.

If, in step 520, the cursor 675 is located over the arrow graphic icon 635 when the select input signal is received, then the CPU 310 performs the Screen Select routine, step 565, discussed below in connection with FIG. 18.

If, in step 520, the cursor 675 is over an icon or menu item for retrieval of a product description request, then the CPU 310 performs a Description routine, step 570, discussed further below in connection with FIG. 19. It will be appreciated that the retrieval of a product description selection element may be displayed as a menu item following reception of a secondary select input signal while the cursor is located over a valve or actuator element (in windows 620, 625 or 685). For example, when a secondary select input signal is received, (e.g., a so-called conventional "right click" of a mouse, or a select signal with a "control" or "shift" key depressed), then the CPU 310 would first display a menu of options, not shown, but which would include "retrieve product description" as a selectable menu item. If the sequence of signals results in the selection of a "retrieve product description" menu item, then the CPU 310 performs step 570 as discussed above. It will be appreciated that other methods of displaying a product description selection icon or menu item may be employed in the alternative or additionally. For example, in some embodiments, simply hovering the cursor over a product in the windows 620 or 625 may generate the product description icon that allows for download of pdf.

If, in step 520, the cursor 675 is located over a menu item or icon that causes the generation of an output file or print, then the CPU 310 performs the Generate Output routine, step 575, discussed below in connection with FIG. 20. It will be appreciated that menu items for the generation of an output file or print may appear under a drop down menu in the tool bars 605. In such a case, the CPU 310 first receives a select input signal while the cursor is over the name of a drop down menu in the tool bars 605, such as "File" 608, displays a menu, not shown, but which includes one or more selections (e.g. print to file, print to paper) for generating an output. If, when the drop down menu is display, the CPU 310 receives a select input signal while the cursor is located over a selection related to generating an output, then the CPU 310 executes step 575 as discussed above. In addition, the user may instead request an output generation by selecting an icon directly displayed on the display 600. For example, FIG. 7 shows a plurality of selectable "output" icons 680. Selection of these icons also results in the CPU executing an output routine in step 575.

If, in step 520, the cursor 675 is located over the show "ToolTips" check box 670 when the select input signal is received, then the CPU 310 performs the Toggle ToolTips routine, step 580, discussed below in connection with FIG. 21.

As discussed above, the CPU 310 may also receive only a cursor movement signal from the user input device 85$_1$, which could result from the rolling of a mouse device. In such a case, the CPU 310 executes Cursor Movement Routine step 585, which is discussed further below in connection with FIG. 22.

The various routines resulting from the user selections are discussed below.

Type Select

Figure 8:
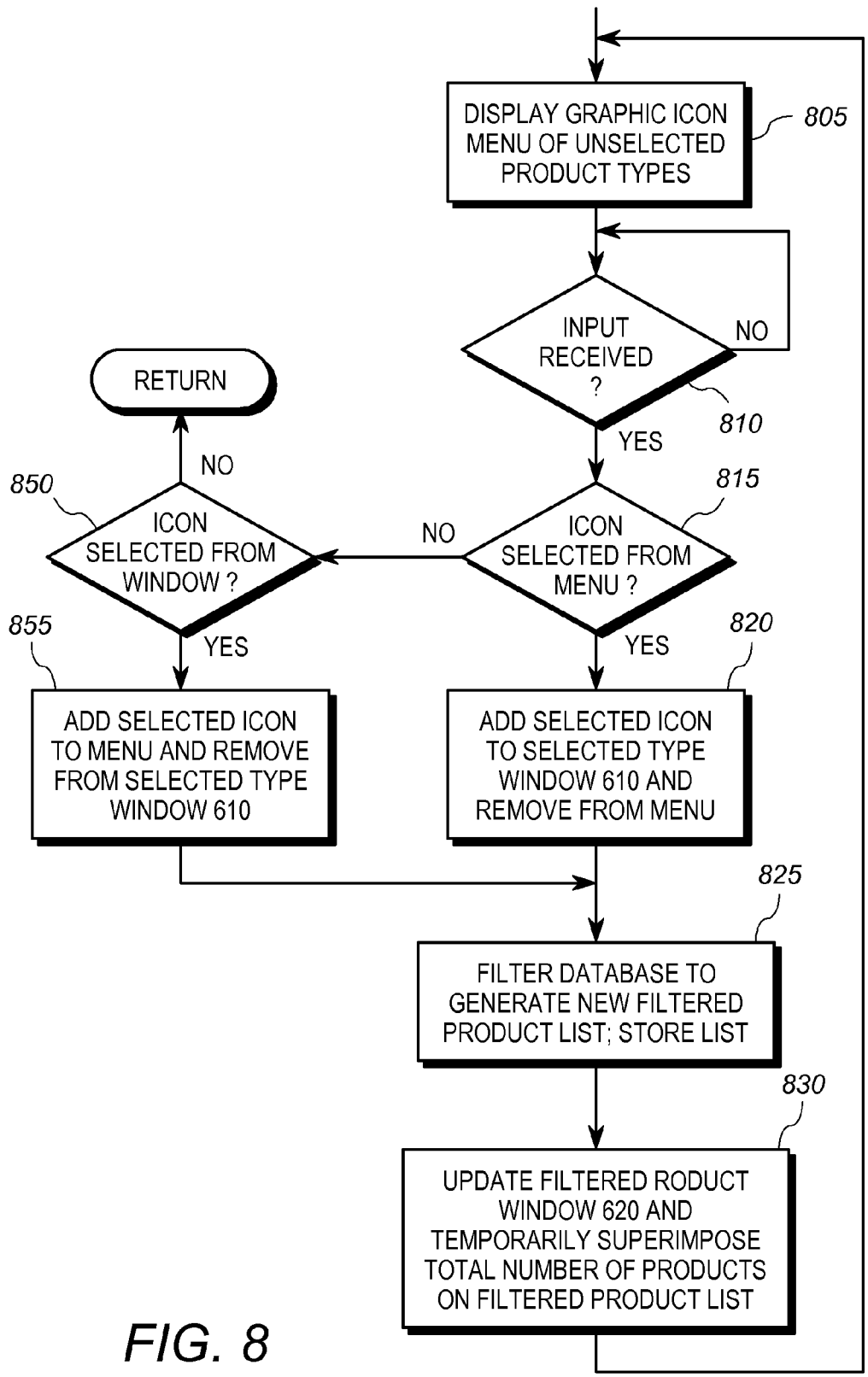
FIG. 8 shows a flow diagram of an exemplary set of operations that may be carried out by a client computer executing the product specifying and selection tool to select or de-select a type of component.

FIG. 8 shows the operations of step 525 that occur when the type select menu item/icon 650 is selected by the user. In step 805, the CPU 310 displays a graphical menu of icons representative of those product types that have not previously been selected. To this end, the CPU 310 stores in memory 305, among other things, for each predefined product type, a corresponding graphical icon and a register or flag indicating whether that product type has been selected.

Referring to FIG. 7 the UI graphic 600 is shown in a state after the type select menu item/icon 650 has been selected. As a result, the selectable type icon menu 611 is displayed. The selectable type icon menu 611 includes icons (e.g. icons 611*a*, 611*b* and 611*c*) of valve types that have not yet been selected by the user. By contrast, the type select window 610 shows icons (e.g. icons 611*d*, 611*e*) that have already been selected. When the selectable type icon menu 611 is open, the user may readily move icons between the menu 611 and the type select window 610 to select or deselect valve types. The selected icons remain in the type select window 610. For example, in FIG. 24, all valve types 611*a*-611*e* have been selected, while in FIG. 7, only valves 611*d* and 611*e* have been selected.

With continued reference to FIG. 7, in this embodiment, each of the valve icons 611*a*, 611*b*, 611*c*, 611*d* and 611*e* has a graphic that is representative of the type of valve. Accordingly, the icon 611*a* includes a butterfly valve image and is associated with the butterfly valve type. Similarly, the icon 611*b* includes a magnetic valve image and is associated with the magnetic valve type. The icon 611*c* includes a zone valve image and is associated with the zone valve type. The icon 611*d* includes a ball valve image and is associated with the ball valve type. The icon 611*e* includes a globe valve image and is associated with the globe valve type. During the user selection process, the user selects desired valve types by selecting the corresponding icon in the menu 611. If the type select window includes a valve type no longer desire, the user may select the undesired valve type to cause the valve type to leave the window 610.

FIG. 8, as mentioned above, shows the operation of the CPU 310 enabling the above described functionality. In particular, in step 805, the CPU 310 causes display of the selectable type icon menu 611 and displays icons of those product types that have a stored flag value indicating that the product type has not been selected (e.g. icons 611*a*, 611*b*, 611*c* of FIG. 7).

Figure 9:
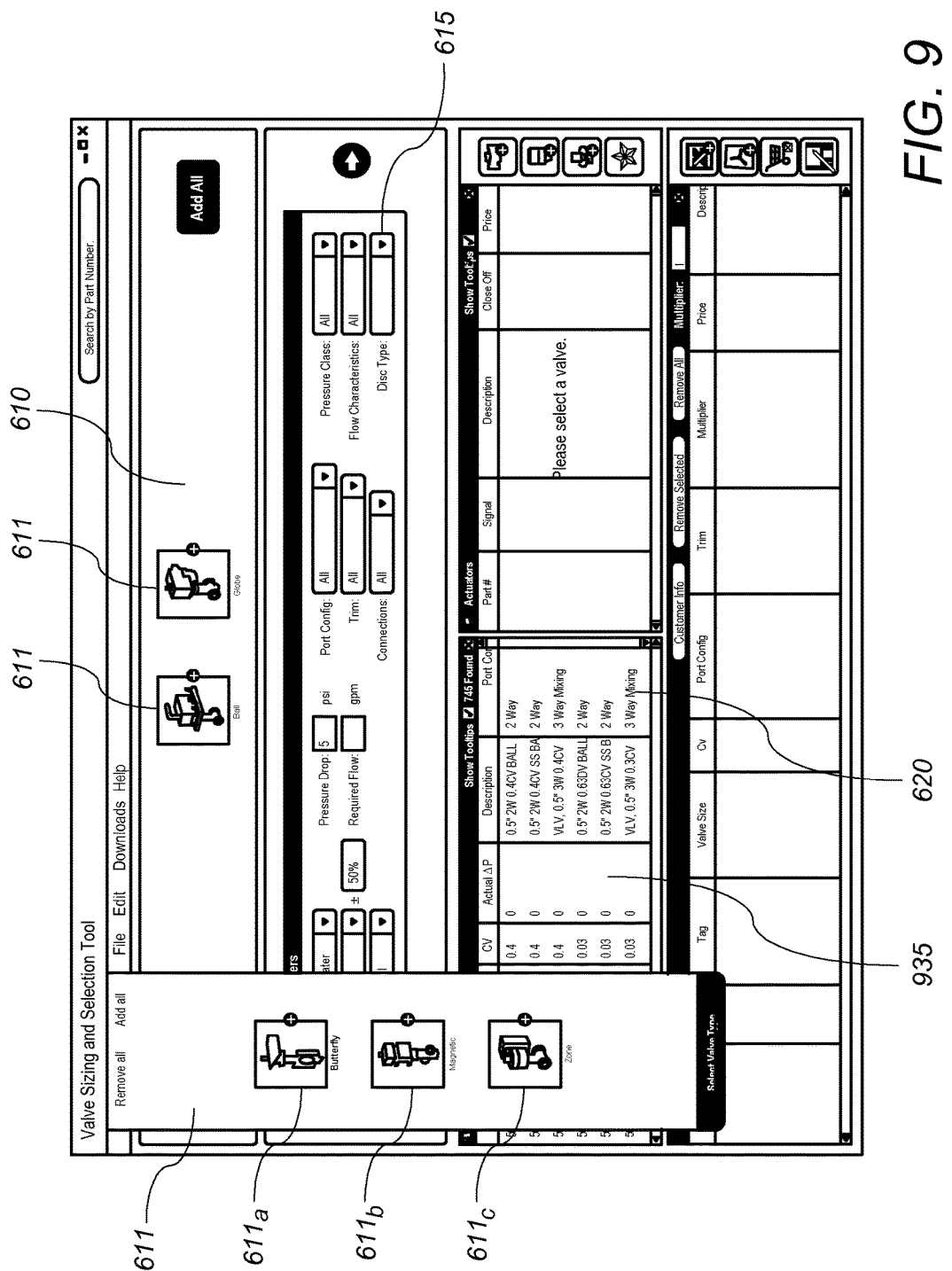
FIG. 9 shows another exemplary user interface screen of the first embodiment of the multi-window user interface graphic of FIG. 6.

FIGS. 7 and 9 show another examples of the UI graphic 600 showing the result of step 805 in an exemplary execution of the PSST 100. After step 805, the UI graphic 600 includes the selectable type icon menu box 611. The menu box 611 is sized to accommodate all of the possible component type icons 611a-611e. In the example of FIG. 9, the selectable type icon menu box 611 includes the butterfly valve icon 611a, the magnetic valve icon 611b, and the zone valve icon 611c, which had not been previously selected.

By contrast, icons for previously selected valves are persistently displayed in the selected type window 610. In the example shown in FIGS. 7 and 9, the ball valve icon 611d and globe valve icon 611e have been previously selected.

Referring again to FIG. 8, after the graphical menu of icons is displayed, the CPU 310 awaits another input from the user input device $85_1$ (step 810). Upon receiving one or more corresponding input signals, the CPU 310 determines in step 815 whether an icon has been selected from the graphical menu (e.g. from selectable type icon menu box 611 of FIGS. 7 and 9). If so, then the CPU 310 proceeds to step 820. If not, then the CPU proceeds to step 850, discussed further below.

In step 820, the CPU 310 causes the selected icon to be added to the selected type window 610 and removed from the selectable type icon menu box 611. The CPU 310 further stores in memory 305 a flag indicating that the selected product type is currently "selected".

Thereafter, in step 825, the CPU 310 filters the parts database 245 to generate a new filtered product list to be displayed in the filtered product window 620. The filtered product list 620a (see FIG. 3) is a list stored in the memory 305 that includes identifiers for all products from the parts database 245 that have one of the selected product types, and have parameters compatible with those defined by user (and displayed in the parameter window 615). Each table entry or line in the filtered product window 620 corresponds to a product identifier on the filtered product list 620a. In step 825, the CPU 310 also stores the newly generated filtered product list in the memory 305.

In step 830, the CPU 310 generates a new filtered product window 620 based on the filtered product list 620a. To this end, the CPU 310 displays information regarding each product on the filtered products list 620a in table format in the filtered product window 620. To this end, the CPU 310 obtains from the parts database 245 select data/parameters regarding each of the products on list 620a. The CPU 310 displays such data and/or parameters in the filtered product window 620 in the rows of the corresponding products. If the entire filtered product list 620a (and corresponding product data) cannot fit within the window 620, then the only a portion of the list is provided in the window 620, along with a conventional scrolling control that allows the user to view other parts of the list.

In addition in step 830, the CPU 310 also performs a count of the filtered products on the filtered product list 620a and displays temporarily in superimposed fashion a message, in enlarged font (compared to other text on the UI graphic 600), indicating the count value. An example of such a message 935 is shown in FIG. 9. Preferably, the superimposed message 935 uses a font size at least twice as large as that used in the other text of the filtered product window 620 in order to catch the attention of the user. The CPU 310 removes the superimposed message 935 after a few seconds.

After step 830, the CPU 310 returns to step 805.

As discussed above, if in step 815 it is determined that the user input is not a selection from the selectable type icon menu box 611, then the CPU 310 executes step 850. In step 850, the CPU 310 determines whether an icon has been selected from the selected type window 610, i.e. which indicates a desire to remove the component type from the group of selected component types. If so, then the CPU 310 proceeds to step 855. If not, then the CPU 310 interprets the input as a command to exit the process and returns to step 515 of FIG. 5.

In step 855, the CPU 310 causes the selected icon to be removed from the selected type window 610 and added to the selectable type icon menu box 611. The CPU 310 further flags that product type as "unselected" and stores the flag in memory 305. The CPU 310 then proceeds to step 825 and operates accordingly to update the filtered product window 620.

Parameter Input

Figure 10:
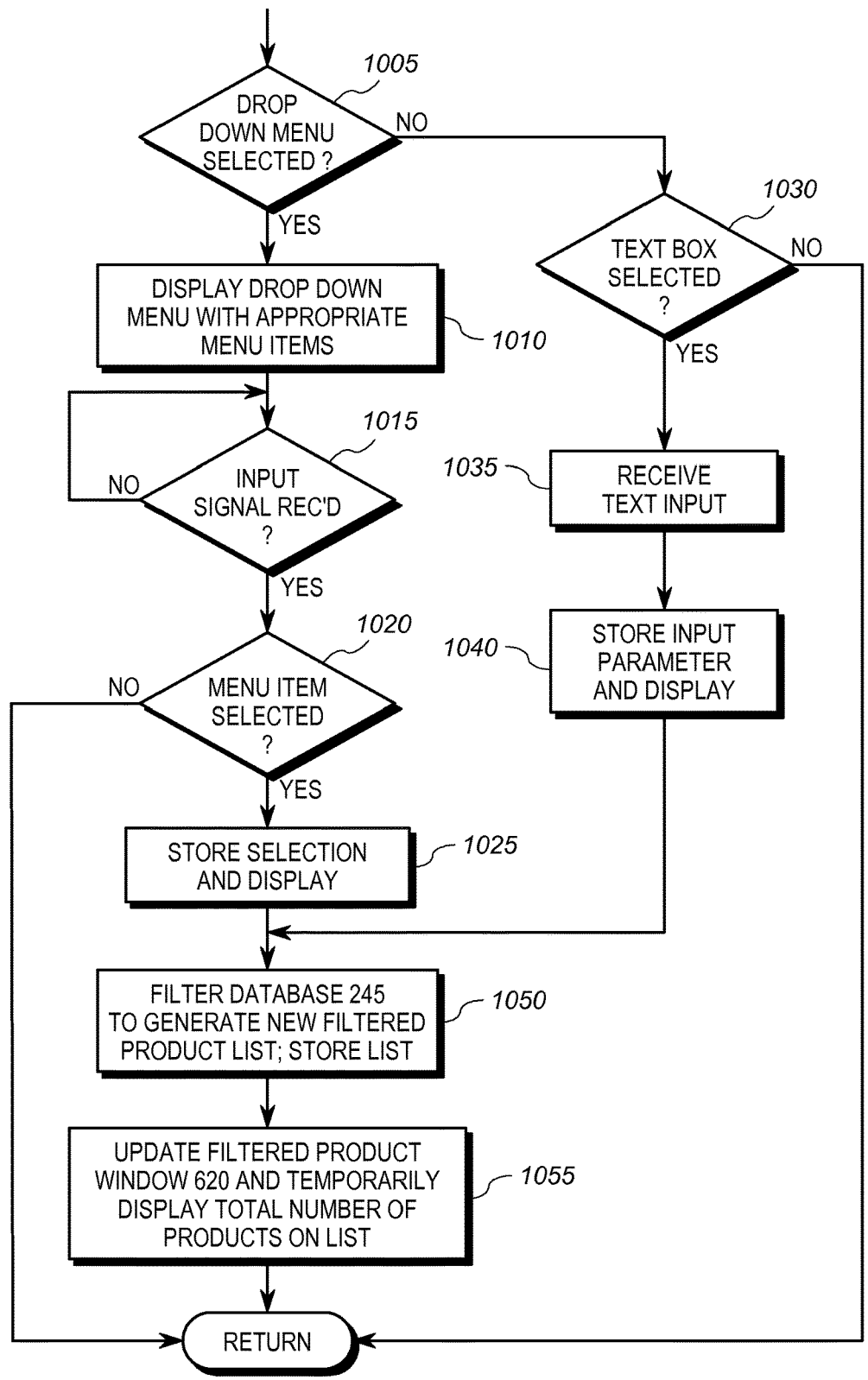
FIG. 10 shows a flow diagram of an exemplary set of operations that may be carried out by a client computer executing the product specifying and selection tool after a product parameter has been specified.

FIG. 10 shows an exemplary embodiment of operations that occur when a user provides an input that changes the value of any of the parameters shown in the parameter window 615. In particular, the operations of FIG. 10 occur when the CPU 310 obtains an input select signal while the cursor 675 is disposed over one of the selectable elements in the parameter window 615. In general, the selectable elements include either drop down menu icons, such as icons 615a, 615b, or text input boxes such as box 615c, 615d. Each selectable element corresponds to a parameter that may be changed or defined. The definable parameters correspond to the types of data stored in the data records 247.sub.x in the parts database 245. Thus definable parameters include choice medium (water, glycol, steam), flow coefficient, line size, pressure drop, steam quantity, steam supply pressure, port configuration, trim, pressure class, connections. Such parameters for selecting valves are conventional.

In the exemplary embodiment, the CPU 310 performs a separate set of operations based on parameter associated with icon or text box that is selected. For example, if the user selects the icon 615a next to the label "Medium:" associated with the "medium" parameter, then the CPU 310 causes display of a specific drop down menu, not shown, that includes the selectable choices "Water", "Glycol", and "Steam" for the medium parameter. For other parameters, other choices may be provided. However, for purposes of clarity of exposition, FIG. 10 shows the generalized operation applicable to all the potential parameter entries.

In step 1005, the CPU 310 determines whether a drop down menu icon such as icons 615a, 615b have been selected. If so, then the CPU 310 proceeds to step 1010. If not, then the CPU 310 proceeds to step 1030. In step 1010, the CPU 310 causes a drop down menu, not shown, to appear next to the selected icon. The drop down menu includes selectable elements relating to the subject parameter. The CPU 310 then awaits additional input indicative of selection of one of the choices on the drop down menu, or a selection that closes the drop down menu. To this end, the CPU 310 determines in step 1015 if an input signal has been received. If so, then the CPU 310 proceeds to step 1020 to process the input signal. If not, then the CPU 310 returns to step 1015. In step 1020, the CPU 310 determines whether a selectable icon from the drop down list has been selected. If so, then the CPU 310 proceeds to step 1025. If not, then the CPU 310 closes the drop down menu and returns to step 515 of FIG. 5. In step 1025, the CPU 310 stores the selected input in memory 305 and displays the selected input in the parameter window 615. The CPU 310 thereafter proceeds to step 1050.

In step 1030, which is executed if the user has not selected a drop down menu in the product parameter window 615, the CPU 310 determines whether the input select signal is disposed over a text input box, such as the boxes 615c, 615d. If so, then the CPU 310 proceeds to step 1035. If not, then the CPU 310 returns to step 515 of FIG. 5.

In step 1035, the CPU 310 highlights the existing text and/or provides a cursor for editing the existing text using keyboard inputs via the user input device 85.sub.1. The CPU 310 in step 1040 thereafter receives text input and an entry signal that signifies the entry of new information in the text box. For example, the user may select the text box 615c and type in a value of "10" for the corresponding parameter, followed by an entry of the "enter" key from a keyboard, or some other input signal. After step 1040, the CPU proceeds to step 1045. Thereafter, the CPU 310 in step 1045 stores the newly input parameter in the memory 305, and causes it to be displayed in the parameter window 615. The CPU 310 then proceeds to step 1050.

In step 1050, the CPU 310 filters the parts database 245 to generate (and store in the memory 305) a new filtered product list 620a based on the current group of selected product types, all previously defined parameters, and the newly defined parameter(s). The CPU 310 stores the new filtered product list in memory 305, and proceeds to step 1055.

In step 1055, the CPU 310 provides results of the filtering step (i.e. the filtered product list) in the filtered product window 620 in a manner similar to step 830, discussed above in connection with FIG. 8. Also in step 1055, the CPU 310 also performs a count of the filtered products as determined in step 825, and displays temporarily the superimposed, large-font message (message 935 of FIG. 9) indicating the number of products in the filtered product list. The CPU 310 removes the superimposed message 935 after a few seconds.

After step 1055, the CPU 310 returns to step 515 of FIG. 5.

It will be appreciated that the types of parameters that can be defined by the user will vary from product to product. Those parameter choices shown in FIG. 6 are suitable for valve selection in a building automation system. As discussed above, entry of a parameter definition may be accomplished by simply typing a value in a dialog/text box associated with the parameter. In other cases, the user may select from a predetermined list of options associated with the parameter. The details of selection and entry methods of parameters, as well as others, can be modified to suit implementation needs. Nevertheless, features of the parameter window 615 illustrated in FIG. 7, and the specific parameters arranged as disclosed, can be particularly advantageous for valve selection and specification.

It will further be appreciated that in step 1040, each digit or letter entered may constitute a detected value entry, resulting in the operation of step 1045, 1050, 1055 after each digit of a multi-digit value. Auto-text completion may also be employed for common parameter values.

Product Select

Figure 11:
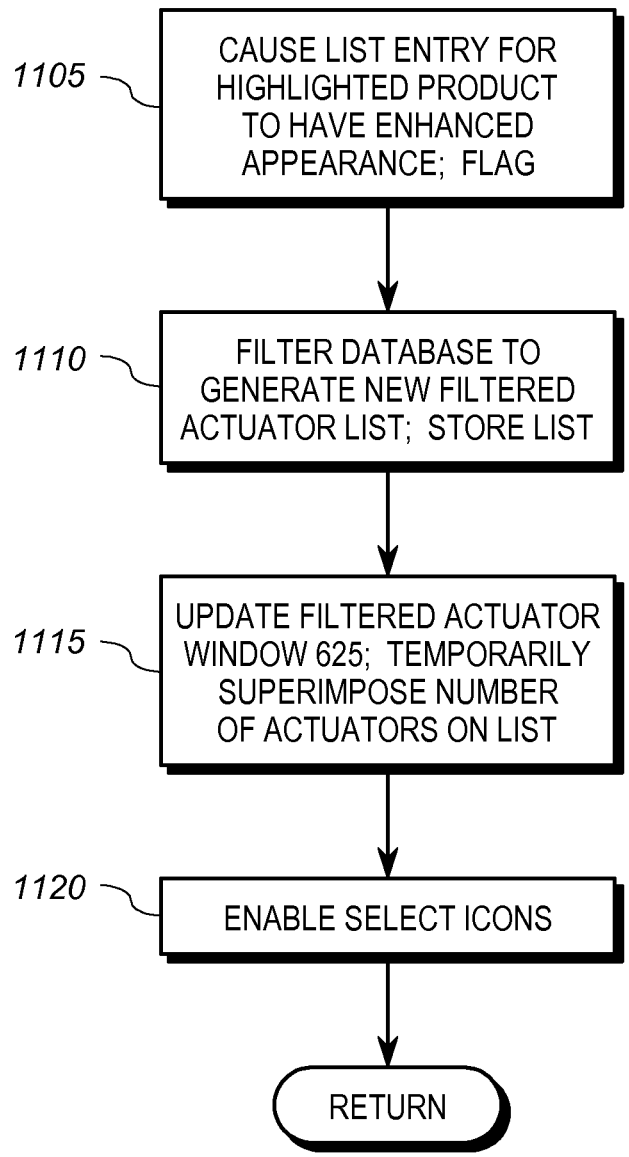
FIG. 11 shows a flow diagram of an exemplary set of operations that may be carried out by a client computer executing the product specifying and selection tool after a product has been highlighted by the user.

FIG. 11 shows a flow diagram of step 535 of FIG. 5, which occurs when a user "highlights" a particular product in the filtered product window 620. In particular, FIG. 11 shows a flow diagram of the operations that occur when an input select signal is received while the cursor 675 is disposed over one of the product entries in the filtered product window 620.

In step 1105, the CPU 310 causes the entire entry (i.e. line of data) for the selected product in the highlighted product to have a different appearance, for instance, using shading or color shading, to illustrate the selection. By way of example, FIG. 7 shows a table entry 705 having a highlighted appearance as a result of the operation of step 1105. Referring again to FIG. 11, the CPU 310 also flags in memory 305 that the product is "highlighted". It will be appreciated that at any given time, multiple products may have "highlighted" status. It will be appreciated that highlighted products may subsequently be un-highlighted by any suitable means, such as centering the cursor 675 over a highlighted product and enter a select signal on the user input device 85$_1$.

In step 1110, the CPU 310 performs a filtering operation on the parts database to generate a filtered actuator list. In particular, in the selection of valves, it is often necessary to select a suitable actuator. In step 1110, the CPU 310 identifies all actuators that would be compatible with all current highlighted products (valves). Moreover, the filtering operation may be based on user-defined actuator parameters, which may be part of a different UI graphic accessible via the arrow graphic 635 of FIG. 6, discussed further below.

Referring again to FIG. 11, once the CPU 310 generates the filtered actuator list, the CPU 310 executes step 1115. In step 1115, the CPU 310 causes the identified actuators and corresponding information to be displayed in the filtered actuator window 625. The CPU 310 also superimposes, in enlarged font and on a temporary basis (similar to step 830 of FIG. 8), the quantity of actuators found in step 1110.

In step 1120, the CPU 310 also causes the appropriate add icons 656, 657 and 658 to be enabled, indicating that the user may select one or more of the icons 656, 657 and 658. As will be discussed further below, the add icons 656, 657 and 658 include icons that allow the user to add a highlighted valve, actuator and/or valve/actuator assembly to the component schedule list 630a stored in the memory 305, discussed further below. The add icons 656, 657 and 658 are only enabled if a valve and/or actuator is highlighted. Accordingly, in step 1120, the CPU 310 causes the "valve" select icon 656 to be enabled because a valve has been highlighted. The "valve" select icon 656 is highlighted as long as one or more valve products have been "highlighted".

The CPU 310 thereafter returns to step 515 of FIG. 5

Actuator Select

Figure 13:
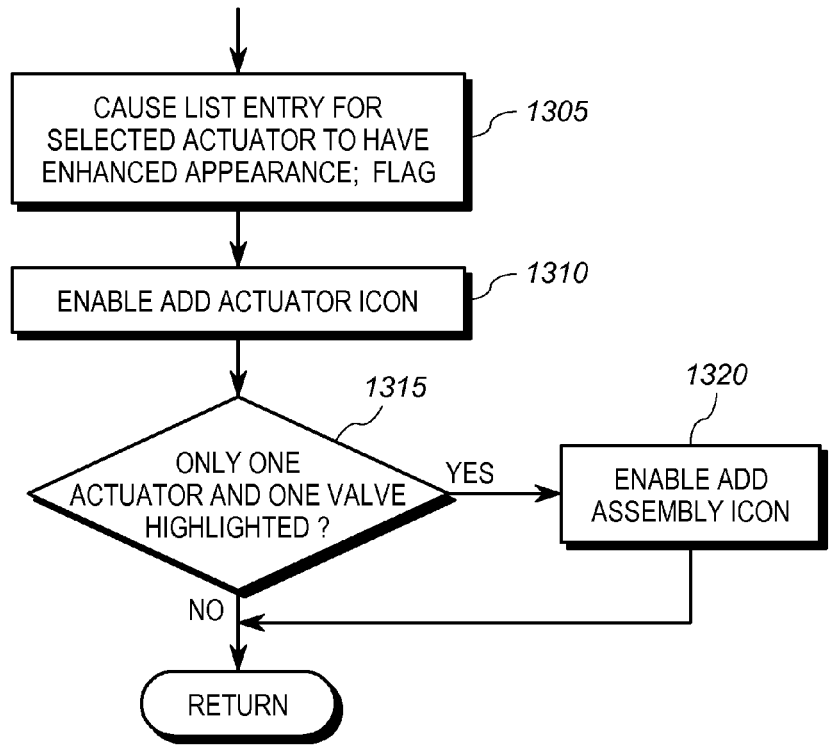
FIG. 13 shows a flow diagram of an exemplary set of operations that may be carried out by a client computer executing the product specifying and selection tool after a product has been highlighted by the user.

FIG. 13 shows a flow diagram of step 540 of FIG. 5, which occurs when a user "highlights" a particular actuator in the filtered actuator window 620. In particular, FIG. 13 shows a flow diagram of the operations that occur when an input select signal is received while the cursor 675 is disposed over one of the entries in the filtered actuator window 625.

In step 1305, the CPU 310 causes the entire entry (i.e. line of data) for the selected product in the highlighted product to have a different appearance, for instance, using shading or color shading, to illustrate the selection. The CPU 310 also flags in memory 305 that the actuator is "highlighted". It will be appreciated that at any given time, multiple products may have "highlighted" status. Highlighted actuators may subsequently be un-highlighted by any suitable conventional means.

In step 1310, the CPU 310 also causes the add actuator icon 657 to be enabled and selectable. The CPU 310 thereafter executes step 1315. In step 1315, the CPU 310 determines if only a single valve in the filtered product window 620 and a single actuator in the filtered actuator window 625 has "highlighted" status. If so, then the CPU 310 proceeds to step 1320. If not, then the CPU 310 returns to step 515 of FIG. 5.

In step 1320, the CPU 310 further enables the "assembly" select icon 658 to be highlighted. Thus, as long as only a single valve and actuator are highlighted in the windows 620 and 625, the user will have the option of adding the assembly (consisting of both the highlighted actuator and highlighted valve) to the component schedule 630a, as will be discussed further below. If there are more or less actuators or valves highlighted, then the CPU 310 does not enable the assembly select icon 658 to be enabled because no single assembly has been defined.

The CPU 310 thereafter returns to step 515 of FIG. 5

Schedule Add

Figure 14:
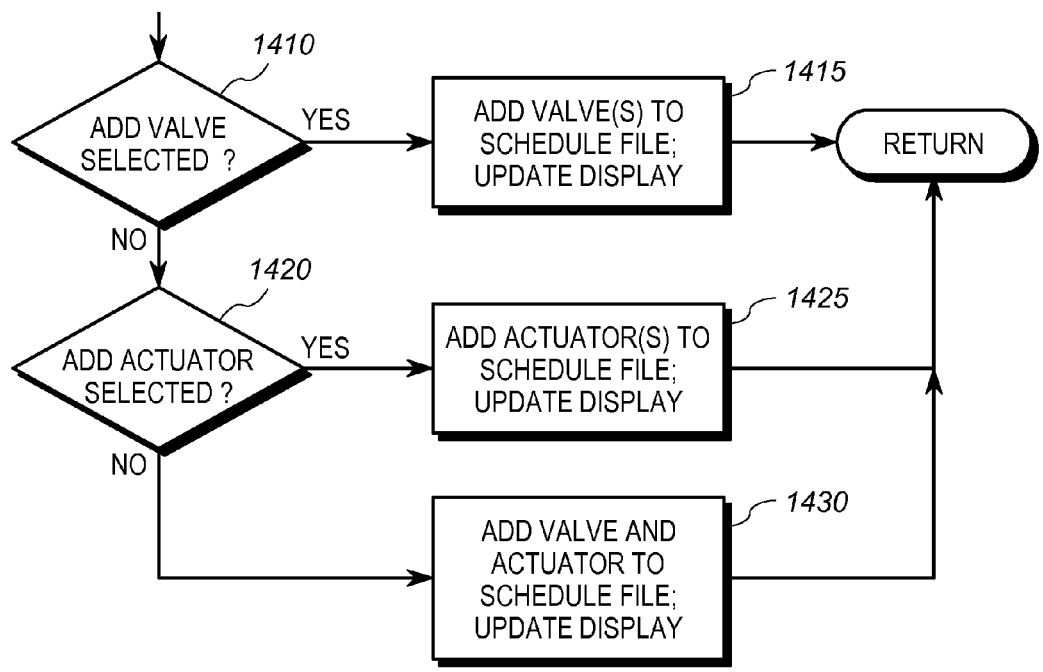
FIG. 14 shows a flow diagram of an exemplary set of operations that may be carried out by a client computer executing the product specifying and selection tool after a product has been highlighted by the user.

FIG. 14 shows a flow diagram of step 545 of FIG. 5, which occurs when a user selects one of the enabled icons 656, 657 or 658. In particular, FIG. 14 shows a flow diagram of the operations that occur when an input select signal is received while the cursor 675 is disposed over one of the icons 656, 657 or 658, and if that icon is enabled. If the cursor 675 is disposed over a non-enabled icon 656, 657 or 658, the CPU 310 does not proceed further, and instead returns to step 515.

In step 1410, the CPU 310 determines whether the add valve icon 656 has been selected. If so, then the CPU 310 proceeds to step 1415. If not, then the CPU 310 proceeds to step 1420. In step 1415, the CPU 310 adds an identification of all "highlighted" valves, i.e. valves having a "highlighted" status, to the component schedule file 630*a* stored in the memory 305.

Figure 16:
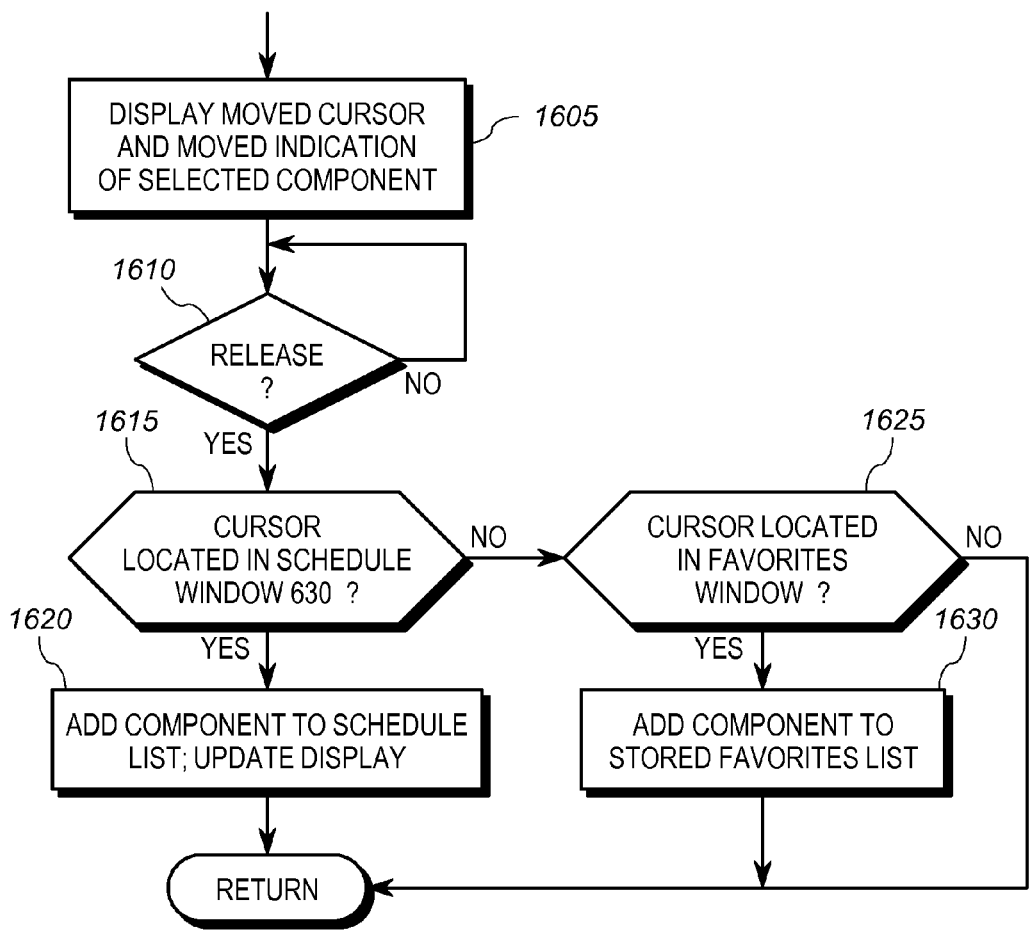
FIG. 16 shows a flow diagram of an exemplary set of operations that may be carried out by a client computer executing the product specifying and selection tool after a product has been highlighted by the user.

The component schedule file 630*a* (see FIG. 3) is a file stored in the memory 305 that includes identifiers for all components from the parts database 245 that have been "added" to the schedule by the user in any of the methods described herein, including those of FIGS. 14 and 16. The component schedule file 630*a* therefore represents the list of components identified by the user for the job being outfitted. The component schedule window 630 in the UI graphic 600 displays a table including the identification (and some parameters) of each component identified in the component schedule file 630*a*. The component schedule file 630*a* also includes any user defined tags, discussed further above.

Thus, in step 1415, the CPU 310 causes the updated component schedule file 630*a* to be stored in the memory 305, and causes the UI graphic 600 to be updated in accordance with the updated component schedule file 630*a*.

After executing step 1415, the CPU 310 returns to step 515 of FIG. 5.

In step 1420, the CPU 310 determines whether the add actuator icon 657 has been selected. If so, then the CPU 310 proceeds to step 1425. If not, then the CPU 310 proceeds to step 1430. In step 1425, the CPU 310 adds an identification of all "highlighted" actuators, i.e. actuators having a "highlighted" status, to the current schedule file 630*a* stored in the memory 305. After executing step 1425, the CPU 310 returns to step 515 of FIG. 5.

In step 1430, which only occurs if the user has selected the add "assembly" icon 658, the CPU 310 adds an identification of the highlighted valve from the window 620 and the highlighted actuator from the window 625 to the current schedule file 630*a* stored in the memory 305. Alternatively, the CPU 310 may only add an identification of the assembly to current schedule file 630*a*. After executing step 1430, the CPU 310 returns to step 515 of FIG. 5.

Open Favorites

Figure 15:
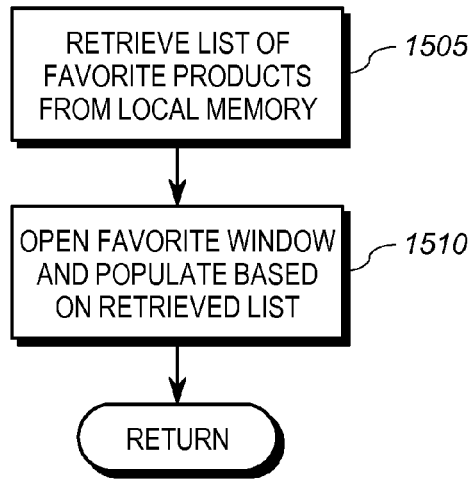
FIG. 15 shows a flow diagram of an exemplary set of operations that may be carried out by a client computer executing the product specifying and selection tool after a product has been highlighted by the user.

FIG. 15 shows a flow diagram of step 550 of FIG. 5, which occurs when a user selects the favorites icon 659 of the UI graphic 600. In particular, FIG. 15 shows a flow diagram of the operations that occur when an input select signal is received while the cursor 675 is disposed over the icon 659.

In step 1505, the CPU 310 retrieves the list of favorites from the user data 330 stored in user's secondary memory 315. In the embodiment described herein, the list of favorites is stored locally as part of the user data 330 for each user. The CPU 310 may suitably store the retrieved list in the primary memory 305.

Figure 24:
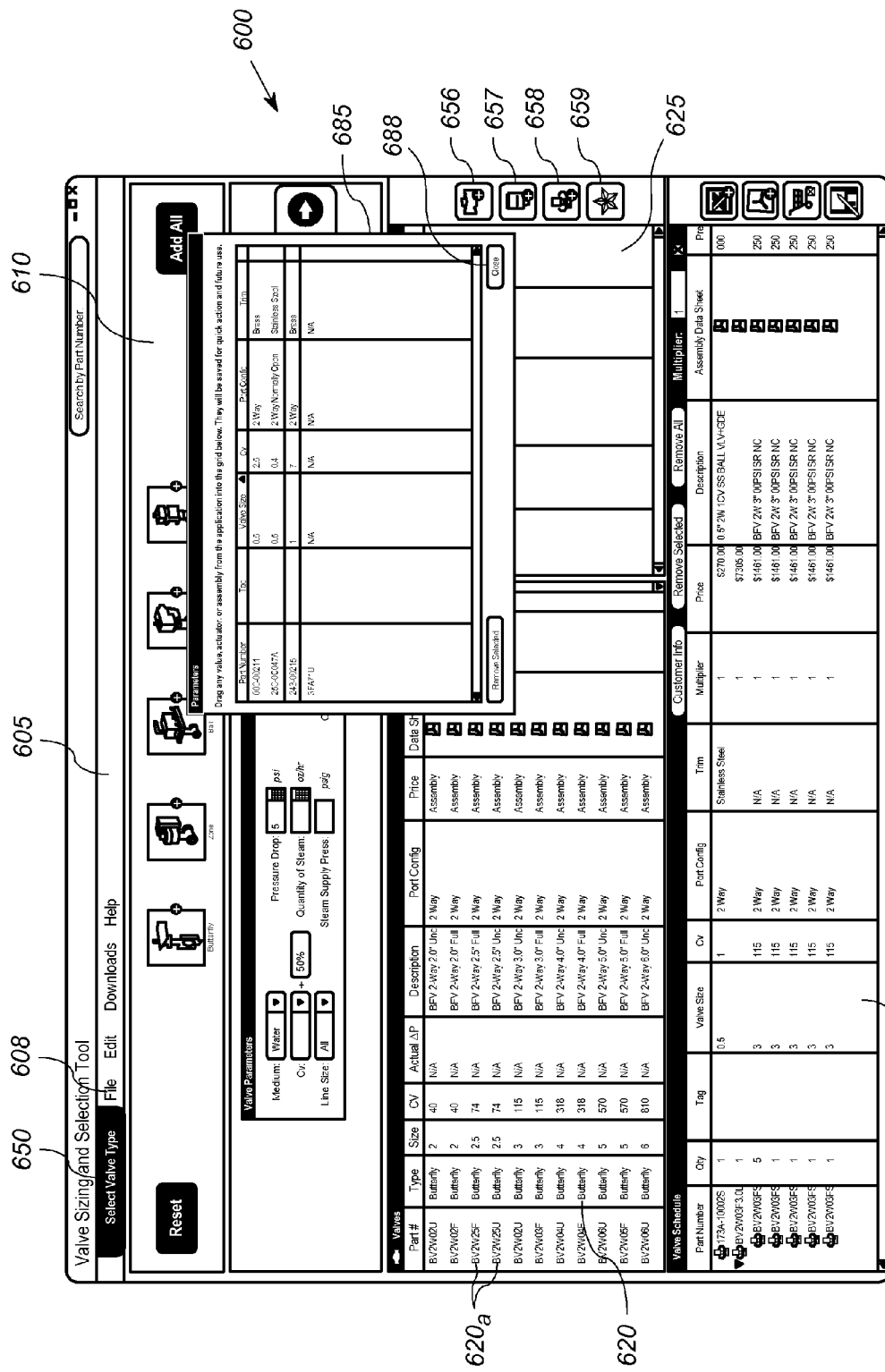
FIG. 24 shows another exemplary user interface screen of the first embodiment of the multi-window user interface graphic of FIG. 6.

After step 1505, the CPU 310 executes step 1510. In step 1510, the CPU 310 causes a display of a new "favorites" window overlaying a portion of the existing graphic 300. For example, FIG. 24 shows an exemplary version of the UI graphic 600 with a favorites window 685 superimposed over portions of the filtered actuator window 625, the parameter window 615 and the type select window 610. The CPU 310 further populates the favorites window 685 with a list of products retrieved in step 1505, and may provide additional data regarding such products using the product data base 245.

The CPU 310 thereafter returns to step 515 of FIG. 5.

Dragged Product

FIG. 16 shows a flow diagram of step 555 of FIG. 5, which occurs when a user "drags" a product from the filtered product window 620, the filtered actuator window 625, or the favorites window 685, if currently displayed. In particular, FIG. 16 shows a flow diagram of the operations that occur when the CPU 310 receives an input select signal that is held (continued) while the cursor 675 is disposed over a product in any of the windows 620, 625 and 685, and before the input select signal is removed, the CPU 310 further receives a cursor movement signal.

In step 1605, the CPU 310 moves the cursor 675 and preferably some indication of the selected product on the UI graphic 600 in accordance with the movement signal. Movement of screen cursors and "dragged" elements in response to movement signals from a suitable user input device $85_1$ is convention.

In step 1610, the CPU 310 detects the removal of the input select signal from the user input $85_1$, as by release of the left-click button of a conventional mouse pointing device. In step 1615, the CPU 310 determines if the cursor 675 is located in the schedule window 630 when the input select signal is released. If so, then the CPU 310 proceeds to step 1620. If not, then the CPU 310 proceeds to step 1625.

In step 1620, the CPU 310 adds information identifying the dragged product to the component schedule list 630*a* that is stored in the memory 305. The CPU 310 furthermore updates the display $80_1$ to show the added product in the schedule window 630. After step 1620, the CPU 310 returns to step 515 of FIG. 5.

In step 1625, the CPU 310 determines if the cursor 675 is located in the favorites window 685 when the input select signal is released. If so, then the CPU 310 proceeds to step 1630. If not, then the CPU 310 returns to step 515 of FIG. 5. In step 1630, the CPU 310 adds information identifying the dragged product to the favorites list that is stored in the user data 330 in the memory 305. The CPU 310 furthermore updates the display $80_1$ to show the added product in the favorites window 685. After step 1630, the CPU 310 returns to step 515 of FIG. 5.

Close Favorites

Figure 17:
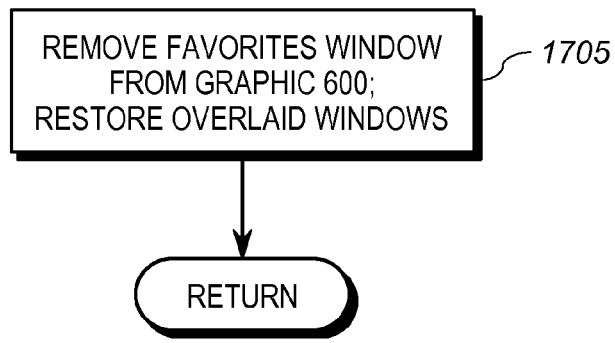
FIG. 17 shows a flow diagram of an exemplary set of operations that may be carried out by a client computer executing the product specifying and selection tool after a product has been highlighted by the user.

FIG. 17 shows a flow diagram of step 560 of FIG. 5, which occurs when a user selects an icon that closes the favorites window 685 of the UI graphic 600. In particular, FIG. 17 shows a flow diagram of the operations that occur when an input select signal is received while the cursor 675 is disposed over the close window icon 688. (See FIG. 24).

In step 1705, the CPU 310 closes the overlaid favorites window 685 and restores the UI graphic 600 in its layout as shown in FIG. 6. The CPU 310 may also suitably store the favorites list back into the user data 330 stored in the secondary memory 315.

The CPU 310 thereafter returns to step 515 of FIG. 5.

Screen Select

Figure 18:
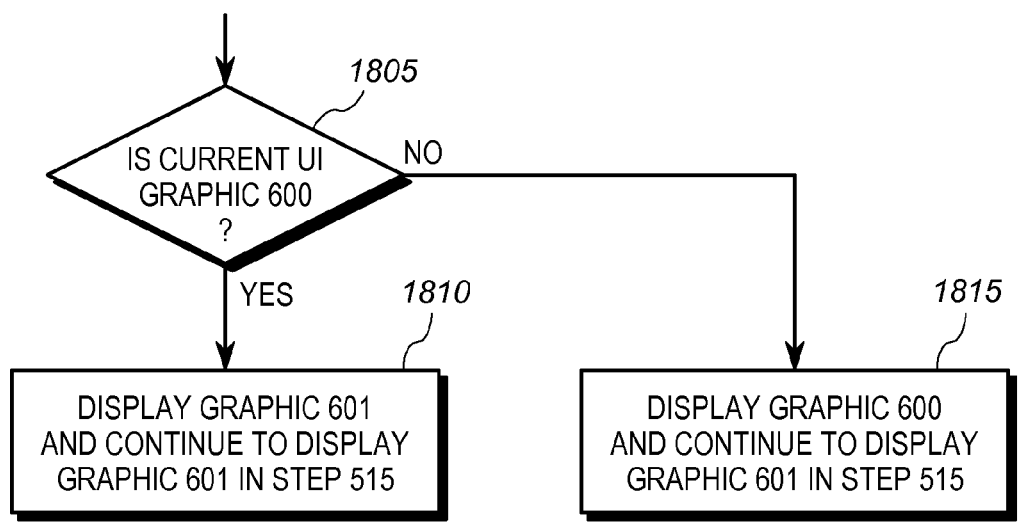
FIG. 18 shows a flow diagram of an exemplary set of operations that may be carried out by a client computer executing the product specifying and selection tool after a product has been highlighted by the user.

FIG. 18 shows a flow diagram of step 565 of FIG. 5, which occurs when a user selects the arrow graphic 635 of the UI graphic 600. In particular, FIG. 18 shows a flow diagram of the operations that occur when an input select signal is received while the cursor 675 is disposed over the arrow graphic 635. (See, e.g. FIGS. 6 and 7).

In particular, the PSST 100 includes the feature that allows the user to define actuator parameters in a parameter window similar to the valve parameter window 615. Specifically, upon selection by the user of the arrow 635, the CPU 310 displays the graphic 601 of FIG. 12 instead of the UI graphic 600. The UI graphic 601 is substantially the same as the UI graphic 600, except that the valve parameter window 615 is replaced by an analogous actuator parameter window 615'. The graphic 601 also includes the arrow 635 to allow the user to navigate back to the original UI graphic 600.

Figure 12:
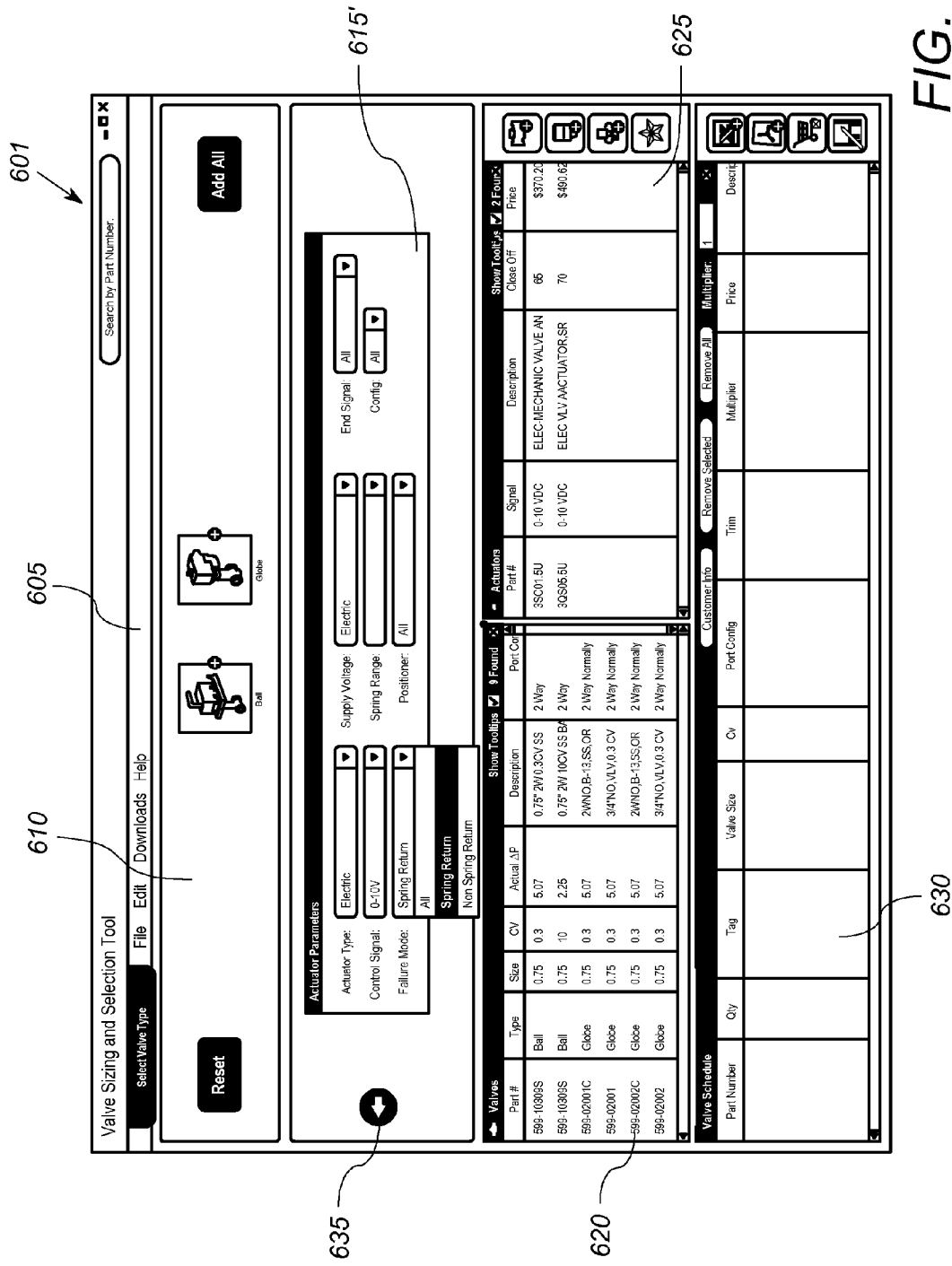
FIG. 12 shows another exemplary user interface screen of the first embodiment of the multi-window user interface graphic of FIG. 6.

To this end, in step 1805, the CPU 310 determines whether the current graphic is the original UI graphic 600, which includes the valve parameter window 615 (as opposed to the graphic 601 of FIG. 12). If so, then the CPU 310 proceeds to step 1810 to generate a multi-window display similar to the UI graphic 601, and to continue to do so in ensuing executions of step 515. After step 1810, the CPU 310 returns to step 515 of FIG. 5 and proceeds accordingly, except that the actuator parameter window 615' is employed in the display graphic 601 in an ongoing manner until switched back.

If the answer in step 1805 is in the negative, then CPU 310 causes display of the UI graphic 600 as per FIG. 6, including the valve parameter window 615 in place of the actuator parameter window 615'. In such a case, the CPU 310 proceeds to step 1815 to generate the multi-window UI graphic 600 multi-window replacing the actuator parameter window 615' with the valve parameter window 615. After step 1815, the CPU 310 returns to step 515 of FIG. 5 and proceeds accordingly, thereafter displaying the UI graphic 600 in subsequent execution of step 515.

It will be appreciated that anytime while the UI graphic 601 includes the actuator parameter window 615', the user may change or define actuator parameters in a manner analogous to that of step 530 of FIG. 5, and the operations of FIG. 10.

Description

Figure 19:
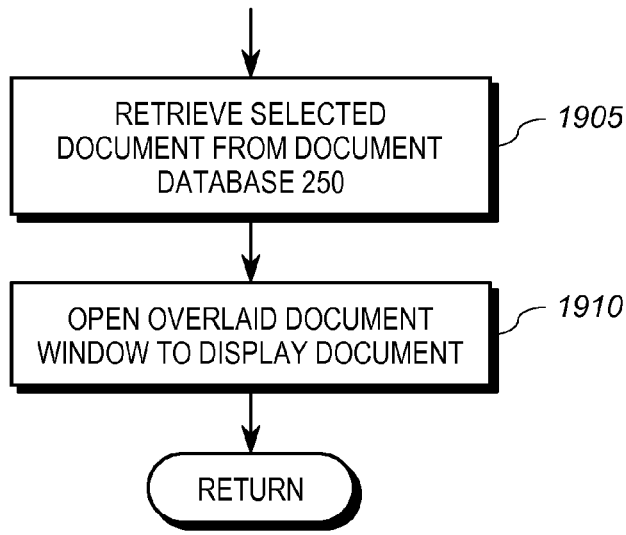
FIG. 19 shows a flow diagram of an exemplary set of operations that may be carried out by a client computer executing the product specifying and selection tool after a product has been highlighted by the user.

FIG. 19 shows the operation of the CPU 310 in response to a user input signal indicating a request for a product description or product documentation. While the product database 245 contains specific parameters for sizing and selection, full product documentation such as data sheets and the like are not included within the product database 245. Nevertheless, during selection and sizing of valves, it may be advantageous for the user to review the manufacturer's documentation. Accordingly, as discussed above, step 570 represents the retrieval of such documentation in response to a user request.

In step 1905, the CPU 310 retrieves a pdf formatted file or other similar document associated with the specified product from the document database 250 from the server computer 50. However, in alternative embodiments, the document database 250 may suitably be downloaded contemporaneously with the original download of the product database 245 in steps 430, 435 of FIG. 4. In such a case, the CPU 310 would simply retrieve the requested documentation file from the secondary storage 315 to the memory 305, and then cause it to be displayed. However, in the embodiment described herein, the document database 250 is not downloaded, and the CPU 310 retrieves the requested document file from the document database 250 at the server 50 of FIGS. 1 and 2.

After step 1905, the CPU 310 executes step 1910. In step 1910, the CPU 310 causes the retrieved document to be displayed in a new window, not shown, that overlays the UI graphic 600. The CPU 310 removes the new document window upon receiving a suitable "closing" input from the user. Any suitable and conventional pdf-formatted document display operations may be employed.

Upon completion of step 1910, the CPU 310 returns to step 515 of FIG. 5 and proceeds accordingly.

Generate Output

Figure 20:
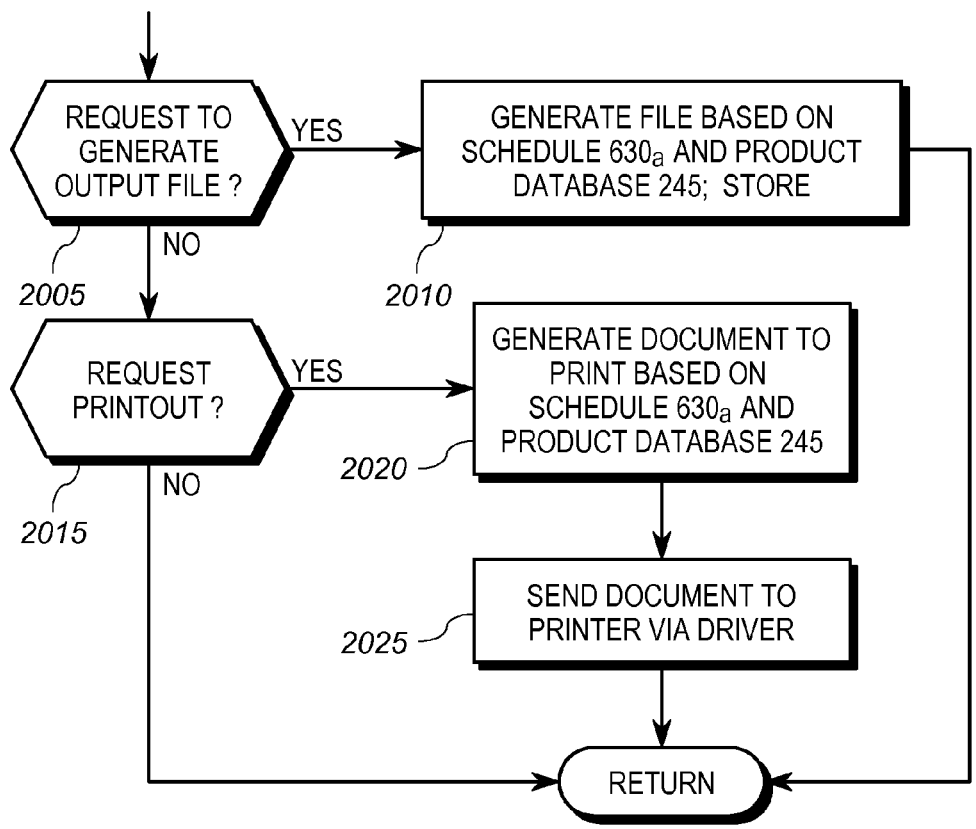
FIG. 20 shows a flow diagram of an exemplary set of operations that may be carried out by a client computer executing the product specifying and selection tool after a product has been highlighted by the user.

FIG. 20 shows a flow diagram of step 575 of FIG. 5, which occurs when a user selects to generate an output of the schedule file. In particular, FIG. 20 shows a flow diagram of the operations that occur when an input select signal is received while the cursor 675 is disposed over one of the output icons 680, or over a selectable text icons or the like for "print schedule" or "generate output file". Such text icons may suitably appear when the "file" menu icon 608 is selected.

In step 2005, the CPU 310 determines whether it has received an input requesting the generation of an output file based on the schedule file. If so, then the CPU 310 executes step 2010. If not, then the CPU 310 proceeds to step 2015.

In step 2010, the CPU 310 generates an output data file, preferably as a comma-separated values (CSV) file using the products listed in the schedule file 630a stored in the memory 305. The output data file may alternatively be an excel or .pdf file. In any event, the CPU 310 provides in the output file a product identifier for each product on the component schedule file 630a, and after each product identifier, sizing and other values for the product obtained from the product database 245. The CPU 310 stores the generated CSV file, which may be used to generate automatically a purchase order or the like in the secondary memory 315. The CPU 310 may thereafter suitably return to FIG. 5, or continue onto step 2015.

In step 2015, the CPU 310 determines whether it has received an input requesting the generation of a printer output based on the component schedule file 630a. If so, then the CPU 310 executes step 2020. If not, then the CPU 310 returns to step 515 of FIG. 5.

In step 2020, the CPU 310 generates a document formatted for printing based on the schedule file, using, among other things, any drivers for available printers. The document to be printed should include the identification of all products in the component schedule file 630a and any suitable set of descriptive parameters retrieved from the product database 245. Thereafter, in step 2025, the CPU 310 provides the formatted document to the printer device, not shown, using driver software stored in the local memory 305. The CPU 310 may thereafter suitably return to step 515 of FIG. 5.

Toggle ToolTips

Figure 21:
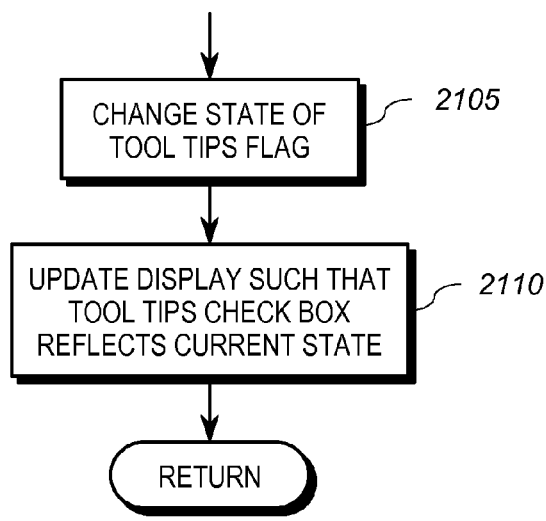
FIG. 21 shows a flow diagram of an exemplary set of operations that may be carried out by a client computer executing the product specifying and selection tool after a product has been highlighted by the user.

FIG. 21 shows a flow diagram of step 580 of FIG. 5, which occurs when a user selects to toggle the ToolTips operation. As will be discussed in detail further below, the Tooltips operation is an operation in which limited details regarding a product are displayed in a small pop-up window when the product is rolled over by the cursor 675. FIG. 7 shows an exemplary pop-up window 710 generated by the Tooltips operation. The ToolTips operation is enabled or disable through a user-changeable "check" box 670. (See FIGS. 6 and 7).

FIG. 21 shows a flow diagram of the operations that occur when an input select signal is received while the cursor 675 is disposed over the ToolTips "check" box 670.

In step 2105, the CPU 310 changes the state of a tooltip flag stored in the memory 305. In other words, if the tooltip flag has a value of "enabled", then the CPU 310 in step 2105 changes the state of the tool tip flag in the memory 305 to "disabled" or an equivalent. Likewise, if the tooltip flag has a value of "disabled", then the CPU 310 in step 2105 changes the state of the tool tip flag in the memory 305 to "enabled".

In step 2110, the CPU 310 changes the UI graphic 600 to reflect the change of state of ToolTips operation within the tooltip box 670 in the UI graphic 600. For example, if the tooltip flag is "enabled", then the CPU 310 in step 2110 causes the display of a "check mark" in the box 670. However, if the tooltip flag is "disabled", then the CPU 310 in step 2110 causes the display of the box 670 as an empty box.

After step 2110, the CPU 310 returns to step 515 of FIG. 5.

Moving Cursor Signals with No Input Select Signal

Figure 22:
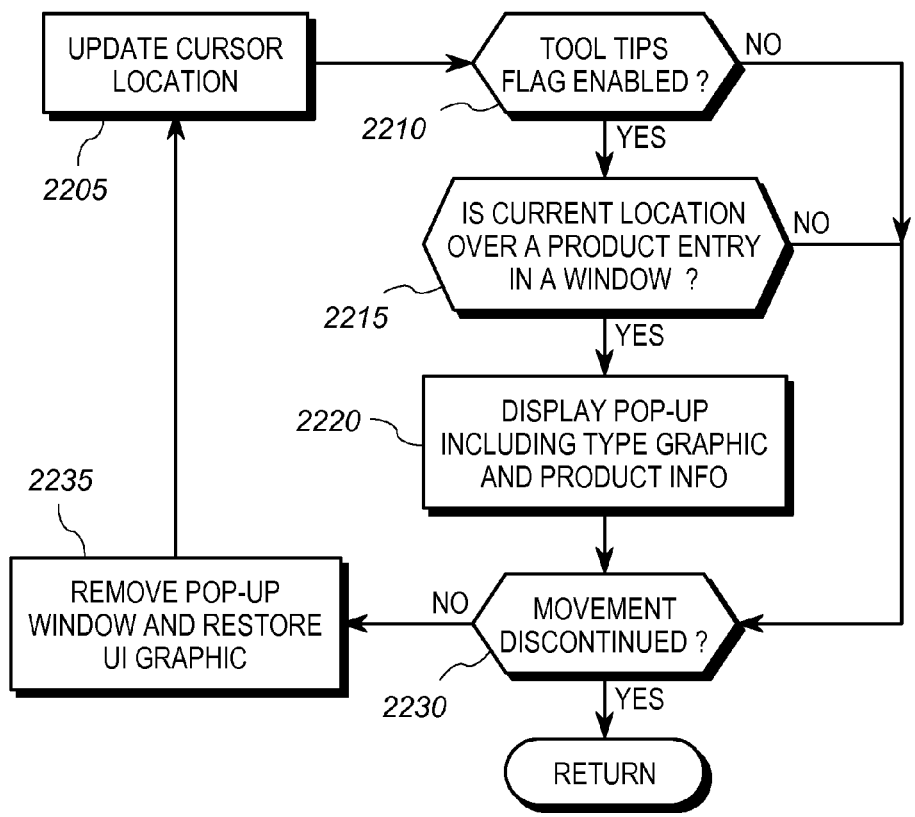
FIG. 22 shows a flow diagram of an exemplary set of operations that may be carried out by a client computer executing the product specifying and selection tool.

FIG. 22 shows the operations of step 585, which occurs when the CPU 310 receives a cursor movement signal in the absence of an input select signal from the user input device $85_1$. For example, the CPU 310 performs the operations of FIG. 22 when the user moves a mouse device, or the like.

In step 2205, the CPU 310 updates the location of the cursor 675 with respect to the UI graphic 600 based on the prior location of the cursor 675 and the direction and duration information in the movement signal. Such operations are conventional to graphic user interfaces. The CPU 310 thereafter or contemporaneously executes step 2210.

In step 2210, the CPU 310 determines whether the tooltips flag is "enabled". If not, then the CPU 310 proceeds to step 2230. If, however, the CPU 310 determines that the tooltips flag is "enabled", then the CPU 310 proceeds to step 2215.

In step 2215, the CPU 310 determines whether the instantaneous location of the cursor 675 on the UI graphic 600 corresponds to a product in any of the windows 620, 625, 630 or 685. If so, then the CPU 310 proceeds to step 2220. If not, then the CPU 310 proceeds to step 2230.

In step 2220, the CPU 310 generates a small pop-up window (e.g. window 710 of FIG. 7) showing product data and a product graphic related to the product on which the cursor 675 is located. To this end, the CPU 310 retrieves from the product database 245 product identification information, product type information, and one or more other details. The CPU 310 then generates a pop-up window that includes a graphic corresponding to the retrieved product type information, and text corresponding to the product identification information and other retrieved details. The CPU 310 causes the generated pop-up window to be displayed in the UI graphic 600 with an indicator showing the product to which it pertains.

In particular, reference is made to the example of such a pop-up window 710 shown in FIG. 7. Specifically, the pop-up window 710 includes a border 715 having a pointing element 720, a graphic 725 corresponding to a product type, product identification information text 730, and other product information text 735. In step 2220, the CPU 310 displays the window 710 such that the pointing element 720 ends proximate the position of the cursor 675, which is located over a table entry for the product identified in the product identification information text 735.

Referring again to FIG. 22, after execution of step 2220, the CPU 310 proceeds to step 2230. In step 2230, the CPU 310 determines whether the movement signal from the user input device $85.sub.1$ has been discontinued. If the movement signal has been discontinued, then the CPU 310 returns to step 515 of FIG. 5. If the movement signal has not been discontinued, then the CPU 310 causes the display to remove the pop-up window in step 2235, if any, and return to step 2205.

It will be appreciated that the PSST 100 may suitably include other features, at least some conventional to window-based graphic user interfaces, which are not included for the purposes of clarity of exposition. For example, the further specific implementation details associated with manipulating columns, tagging and the like within the component schedule window 630, based on the explanations described herein, are conventional and may take many forms.

Another feature of one implementation of the schedule window 630 is that multiple quantities of the same element may be presented in collapsible hierarchical mode, such as the hierarchical list elements 682 of FIG. 7. It is noted that by allowing multiple quantities of an element to be selectively expanded out to individual elements, individual elements of a set of multiple identical devices may carry different tags. Again, further specific implementation details of such operations may take many forms and are conventional in nature.

It will be appreciated that the detailed software implementation of the operations as described herein may readily be carried out using commercially available development tools, such as the FLEX BUILDER™ line of products available from Adobe Corporation.

It will be appreciated that the above-describe embodiments are merely exemplary, and that those of ordinary skill in the art may readily devise their own implementations and adaptations that incorporate the principles of the present invention and fall within the spirit and scope thereof.

The invention claimed is:

1. A method for generating an output identifying components for a system, each of the components having one of a plurality of types, each of the components defined by a plurality of specifications, the method comprising:

employing a network interface to receive a selection tool into a computer system memory;

executing the selection tool on a processing device to open a multi-window display that includes a schedule window, a product type select window, and a product window;

executing the selection tool on the processing device, to display a menu of a plurality of graphic elements, each of the plurality of graphic elements representative of and corresponding to a product type;

executing the selection tool on the processing device to receive a user input selecting a first graphic element from the menu;

executing the selection tool on the processing device, subsequent to receiving the user input, to update the multi-window display to display the menu of the plurality of graphic elements without the first graphic element and to display the first graphic element in the product type select window;

displaying a parameter window simultaneously with the display of the product type select window, the product window and the schedule window, the parameter window comprising a plurality of interactive elements facilitating user identification of product parameters, each of the product parameters constituting physical characteristics;

receiving user input in the plurality of interactive elements, the user input defining a first product parameter;

executing the selection tool on the processing device, to filter a component database to identify a first set of components having a component type corresponding to the first graphic element and the first product parameter; and executing the selection tool on the processing device to display in the product window data a list of components from the first set of components.

2. The method of claim 1, further comprising:

receiving input selecting one or more components from the list of components; and storing the selected one or more components in a data file in a memory.

3. The method of claim 2, further comprising displaying the selected one or more components in the schedule window contemporaneously with the display of the product type select window and the product window menu, to enable display of the selected one or more components contemporaneously with the first graphic element in the product type select window.

4. The method of claim 2, further comprising:

generating an output file based on the data file in the memory; and printing the output file.

5. The method of claim 2, further comprising:

generating a count of the identified first set of components having a component type corresponding to the first graphic element;

causing display of the count over at least a portion of the product window; and removing the display of the count after a predetermined time.

6. The method of claim 2, wherein receiving input selecting one or more components from the first list of components further comprises:

obtaining a first select input selecting a component within the product window; and obtaining an input indicative of a user selection of a first icon located on the display outside of the product window.

7. The method of claim 1, further comprising, after receiving the user input selecting the first graphic element from the menu:

at least temporarily removing the menu from the display; and displaying contemporaneously the product type select window, the product window and the schedule window.

8. The method of claim 7, further comprising, after receiving the user input selecting the first graphic element from the menu, and before removing the menu from the display:

removing the first graphic element from the menu.

9. The method of claim 1, further comprising:

detecting a movement signal from a user input device;

causing the display to include a moving cursor element responsive to the movement signal;

displaying a pop-up window containing information regarding a second component when the displayed cursor is located within the display proximate to displayed information regarding the second component.

10. The method of claim 9, wherein the information in the pop-up window includes a graphic representation of a component type corresponding to the second component, and identification information regarding the second component.

11. A method for generating an output identifying components for a system, each of the components having one of a plurality of types, each of the components defined by a plurality of specifications, the method comprising:

employing a network interface to receive a selection tool into a computer system memory;

executing the selection tool on a processing device to open a multi-window display that includes a schedule window, a product type select window, a first product window, and a second product window;

executing the selection tool to display a menu of a plurality of graphic elements, each of the plurality of graphic elements representative of and corresponding to a product type;

executing the selection tool to receive a user input selecting a first graphic element from the menu;

executing the selection tool on the processing device, subsequent to receiving the user input, to update the multi-window display to display the first graphic element in the product type select window;

displaying a parameter window simultaneously with the display of the schedule window, the product type select window, the first product window, and the second product window, the parameter window comprising a plurality of interactive elements facilitating user identification of product parameters, each of the product parameters constituting physical characteristics associated with the first set of components;

receiving user input in the plurality of interactive elements, the user input defining a first product parameter;

executing the selection tool to filter a component database to identify a first set of components having a component type corresponding to the first graphic element and the first parameter;

executing the selection tool to display in the first product window data a list of components from the first set of components;

executing the selection tool to obtain a first select input selecting a first component within the first product window;

obtaining an input indicative of a first user selection of one of a plurality of icons located on the display outside of the first product window;

updating the schedule window to include information identifying at least one added component based on the selected icon to enable display of the at least one added component contemporaneously with the first graphic element in the product type select window;

executing the selection tool to display, responsive to obtaining first select input, a second list of one or more components linked to the first component in the second product window; and updating the display to remove the parameter window and display a second parameter window simultaneously with the display of the product type select window, the first product window, the second product window, and the schedule window, the second parameter window comprising a plurality of interactive elements facilitating user identification of second product parameters for the second list of one or more components, each of the second product parameters constituting physical characteristics associated with the second list of one or more components.

12. The method of claim 11, wherein:

the obtained input is indicative of the first user selection of a first icon, and wherein the at least one added component is the first component.

13. The method of claim 12, wherein:
the obtained input is indicative of the first user selection of a second icon, and wherein the at least one added component comprises the first component and a second component of the second list of one or more components linked to the first component.

14. The method of claim 11, further comprising storing information regarding the at least one added component in a data file in a memory.

15. The method of claim 14, further comprising:
generating an output file based on the data file in the memory; and
printing the output file.

* * * * *